United States Patent
Araki et al.

(10) Patent No.: US 6,603,642 B1
(45) Date of Patent: Aug. 5, 2003

(54) MAGNETIC TRANSDUCER HAVING A PLURALITY OF MAGNETIC LAYERS STACKED ALTERNATELY WITH A PLURALITY OF NONMAGNETIC LAYERS AND A FIXED-ORIENTATION-OF-MAGNETIZATION LAYER AND THIN FILM MAGNETIC HEAD INCLUDING THE MAGNETIC TRANSDUCER

(75) Inventors: Satoru Araki, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/685,891

(22) Filed: Oct. 11, 2000

Related U.S. Application Data
(60) Provisional application No. 60/189,469, filed on Mar. 15, 2000.

(51) Int. Cl.$^7$ ................................................. G11B 5/39
(52) U.S. Cl. ................... 360/324; 360/324.11; 360/319
(58) Field of Search ............................ 360/317, 319, 360/324–324.2

(56) References Cited

U.S. PATENT DOCUMENTS

| | | | |
|---|---|---|---|
| 5,880,911 A | * | 3/1999 | Ishihara et al. ............. 360/324 |
| 5,901,018 A | | 5/1999 | Fontana, Jr. et al. ..... 360/324.2 |
| 6,137,662 A | * | 10/2000 | Huai et al. ............. 360/327.22 |

FOREIGN PATENT DOCUMENTS

| | | |
|---|---|---|
| JP | 4-360009 | 12/1992 |
| JP | 5-067820 | 3/1993 |
| JP | 5-090026 | 4/1993 |
| JP | 5-275769 | 10/1993 |
| JP | 7-078316 | 3/1995 |
| JP | 9-129445 | 5/1997 |
| JP | 9-180135 | 7/1997 |

* cited by examiner

*Primary Examiner*—Jefferson Evans
(74) *Attorney, Agent, or Firm*—Oliff & Berridge, PLC.

(57) ABSTRACT

An object of the invention is to provide a magnetic transducer and a thin film magnetic head using the same, which can be manufactured by a simple manufacturing process and can obtain good output. The thin film magnetic head has a stack including a plurality of magnetic layers stacked alternately with a plurality of nonmagnetic layers. A layer having the fixed orientation of magnetization is formed on at least one side of the stack in the direction of stacking. The layer has a stacked structure comprising an antiferromagnetic layer and an exchange coupling layer exchange coupling with the antiferromagnetic layer. The magnetic layers of the stack are changed into a single magnetic domain by a magnetic field generated by exchange coupling between the antiferromagnetic layer and the exchange coupling layer so as to prevent Barkhausen noise. Since the layer is formed on at least one side of the stack in the direction of stacking, a manufacturing process is simplified.

14 Claims, 16 Drawing Sheets

MAGNETIC TRANSDUCER HAVING A PLURALITY OF MAGNETIC LAYERS STACKED ALTERNATELY WITH A PLURALITY OF NONMAGNETIC LAYERS AND A FIXED-ORIENTATION-OF-MAGNETIZATION LAYER AND THIN FILM MAGNETIC HEAD INCLUDING THE MAGNETIC TRANSDUCER

This application claims benefit from Provisional Application No. 60/189,469 filed Mar. 15, 2000.

BACKGROUND OF THE INVENTION

1. Field of the Invention

The invention relates to a magnetic transducer and a thin film magnetic head using the same. More particularly, the invention relates to a magnetic transducer and a thin film magnetic head using the same, which can be manufactured by a simple manufacturing process and can obtain good output.

2. Description of the Related Art

Recently, an improvement in performance of a thin film magnetic head has been sought in accordance with an increase in a surface recording density of a hard disk or the like. A composite thin film magnetic head, which has a stacked structure comprising a reproducing head having a magnetoresistive element (hereinafter referred to as an MR element) that is a type of magnetic transducer and a recording head having an inductive magnetic transducer, is widely used as the thin film magnetic head.

MR elements include an element using a magnetic film (an AMR film) exhibiting an anisotropic magnetoresistive effect (an AMR effect), and an element using a magnetic film (a GMR film) exhibiting a giant magnetoresistive effect (a GMR effect). The GMR film is mainly used in the MR element for the reproducing head whose surface recording density exceeds 3 Gbit/inch$^2$. As the GMR film, a "multi-layered type (antiferromagnetic type)" film, an "inductive ferromagnetic type" film, a "granular type" film, a "spin valve type" film and the like are proposed. Of these types of films, the spin valve type GMR film is used for the industrialization of a magnetic head.

The spin valve type GMR film has a stacked structure comprising a nonmagnetic layer; a magnetic layer having the fixed orientation of magnetization; and a magnetic layer having the orientation of magnetization changing in accordance with a signal magnetic field, in which the magnetic layers are stacked with the nonmagnetic layer in between. Electrical resistance changes in accordance with a relative angle between the orientations of magnetizations of the two magnetic layers. The spin valve type GMR film obtains the rate of resistance change of 2% to 6% (U.S. Pat. No. 5,408,377).

Moreover, a "tunnel junction type" GMR film utilizing a tunnel current passing through a thin insulating layer has been recently developed (U.S. Pat. No. 5,901,018). The tunnel junction type GMR film has a structure in which an insulating layer is sandwiched between two magnetic layers. During the passage of the tunnel current through the insulating layer, electrical resistance changes in accordance with the signal magnetic field. The tunnel junction type GMR film obtains higher electrical resistance as a junction area becomes smaller. However, shot noise is caused and thus the S/N (signal to noise) ratio becomes low. Consequently, the tunnel junction type GMR film has the limitations of improvement in properties of the magnetic head.

Therefore, attention has been recently paid to an MR element having the so-called CPP (Current Perpendicular to the Plane) structure in which a current is passed through the multilayered type GMR film in the direction of stacking (Japanese Unexamined Patent Application Publication No. Hei 5-275769). The multilayered type GMR film has a stack comprising magnetic layers stacked alternately with nonmagnetic layers. The orientations of magnetizations of the magnetic layers change in accordance with the signal magnetic field, and thus electrical resistance changes. The above-mentioned multilayered type GMR film is disclosed in, for example, Japanese Unexamined Patent Application Publication No. Hei 4-360009, Japanese Patent No. 2610376, Japanese Unexamined Patent Application Publication No. Hei 5-90026, Japanese Unexamined Patent Application Publication No. Hei 7-78316 and Japanese Unexamined Patent Application Publication No. Hei 9-180135. According to the multilayered type GMR film, the rate of resistance change is about 1% to 10% when the current is passed perpendicularly to the direction of stacking (Japanese Unexamined Patent Application Publication No. Hei 5-90026). The rate of resistance change is about 10% to 15% when the current is passed in the direction of stacking.

The above-described MR element has magnetic domain control layers for controlling the orientations of magnetizations of the magnetic layers in order to prevent so-called Barkhausen noise. For example, the multilayered type GMR film has a pair of magnetic domain control layers on both sides in the direction perpendicular to the direction of stacking of the GMR film (Japanese Unexamined Patent Application Publication No. Hei 9-180135).

However, a problem exists. A manufacturing process is complicated when the magnetic domain control layers are formed so as to sandwich the stack therebetween in the direction perpendicular to the direction of stack as described above. Another problem exists. It is preferable that the magnetic domain control layers are separated from the stack, because the rate of resistance change decreases when the current passing through the stack is diverted into the magnetic domain control layers. However, a magnetic domain cannot be sufficiently controlled in the above-mentioned arrangement.

SUMMARY OF THE INVENTION

It is an object of the invention to provide a magnetic transducer and a thin film magnetic head, which can be manufactured by a simple manufacturing process and can obtain good output.

A magnetic transducer of the invention comprises a stack having a plurality of magnetic layers stacked alternately with a plurality of nonmagnetic layers; and a magnetic domain control layer formed on at least one side of the stack in the direction of stacking, for controlling the orientations of magnetizations of the magnetic layers.

In a magnetic transducer of the invention, the orientations of magnetizations of the magnetic layers of the stack are controlled by the magnetic domain control layer.

Another magnetic transducer of the invention comprises a stack having a plurality of magnetic layers stacked alternately with a plurality of nonmagnetic layers; and a magnetic field applying layer formed on at least one side of the stack in the direction of stacking, for applying a magnetic field in a fixed direction to at least a part of the stack.

In another magnetic transducer of the invention, the magnetic field is applied to at least a part of the stack by the magnetic field applying layer. The orientations of magnetizations of the magnetic layers of the stack are controlled by the applied magnetic field.

Still another magnetic transducer of the invention comprises a stack having a plurality of magnetic layers stacked alternately with a plurality of nonmagnetic layers; and a layer having the fixed orientation of magnetization formed on at least one side of the stack in the direction of stacking and having magnetization fixed in a fixed direction.

In still another magnetic transducer of the invention, the orientations of magnetizations of the magnetic layers of the stack are controlled by action of the magnetization of the layer fixed in a fixed direction.

Preferably, the layer has an antiferromagnetic layer and an exchange coupling layer exchange coupling with the antiferromagnetic layer. Preferably, the antiferromagnetic layer is made of a material containing at least one element in a group including Pt (platinum), Ru (ruthenium), Rh (rhodium), Pd (palladium), Ni (nickel), Au (gold), Ag (silver), Cu (copper), Ir (iridium), Cr (chromium) and Fe (iron), and Mn (manganese).

Preferably, the exchange coupling layer is made of a material containing at least one element in a group including Fe, Co (cobalt) and Ni. Preferably, an inserted layer made of a nonmagnetic material is provided between the layer and the stack. Preferably, the inserted layer is made of a material containing at least one element in a group including Au, Ag, Cu, Ru, Rh, Re (rhenium), platinum and tungsten (W). Preferably, a thickness of the inserted layer is from 1 nm to 10 nm inclusive.

Preferably, the stack has a projecting portion facing a signal magnetic field. Preferably, a length of the projecting portion along the projecting direction thereof is 0.1 $\mu$m or less. Preferably, a magnetic field capture (or take in) limiting portion for partially limiting an effect of a signal magnetic field is provided in an area on a side of the stack facing a signal magnetic field. Preferably, a magnetic field capture limiting portion made of a magnetic material is provided at a position corresponding to a part of the stack on a side of the stack facing a signal magnetic field.

Preferably, at least one of the plurality of magnetic layers contains a material containing at least Co in a group including Co, Fe and Ni, or a material containing at least Ni in a group including Ni, Co, Fe, Cr, Ta (tantalum), Rh (rhodium), Mo (molybdenum), Zr (zirconium) and Nb (niobium). Preferably, at least one of the plurality of magnetic layers includes a nickel-containing layer made of a material containing at least Ni in a group including Ni, Co, Fe, Cr, Ta, Rh, Mo, Zr and Nb, and a cobalt-containing layer made of a material containing at least Co in a group including Co, Fe and Ni.

Preferably, a thickness of each of the magnetic layers is from 1 nm to 6 nm inclusive. Preferably, the number of the magnetic layers is from 2 to 20 inclusive. Preferably, at least one of the nonmagnetic layers is made of a material containing at least one element in a group including Au, Ag, Cu, Ru, Rh, Re, Pt and W. Preferably, at least one of the nonmagnetic layers is made of a material containing Ni and Cr. Preferably, one of the nonmagnetic layers, which is located on one outermost side in the direction of stacking, is made of a material containing Ni and Cr.

Preferably, a thickness of each of the nonmagnetic layers is set so as to locally maximize antiferromagnetic coupling energy induced between two magnetic layers adjacent to each other with each of the nonmagnetic layers in between. Preferably, the antiferromagnetic coupling energy induced between two magnetic layers adjacent to each other with each of the nonmagnetic layers in between is from $0.1 \times 10^{-4}$ $J/m^2$ to $2.0 \times 10^{-4}$ $J/m^2$ inclusive.

Preferably, the stack has a plurality of regions into which the stack is divided in the direction of stacking, and at least two regions of the plurality of regions differ from each other in a material or composition of the magnetic layers. Preferably, the stack has a first region including the magnetic layers made of a material containing at least Ni in a group including Ni, Co, Fe, Cr, Ta, Rh, Mo, Zr and Nb, and a second region including the magnetic layers made of a material containing at least Co in a group including Ni, Co and Fe.

A thin film magnetic head of the invention has a magnetic transducer described above.

Preferably, a thin film magnetic head of the invention further comprises a current path for passing a current through the stack in the direction of stacking. Preferably, a thin film magnetic head further comprises a pair of shield layers for sandwiching the stack therebetween with a pair of gap layers in between, wherein the shield layers and the gap layers function as the current path.

Other and further objects, features and advantages of the invention will appear more fully from the following description.

DETAILED DESCRIPTION OF THE PREFERRED EMBODIMENTS

First Embodiment

<Structures of MR Element and Thin Film Magnetic Head>

Firstly, a structure of a thin film magnetic head according to a first embodiment of the invention will be described with reference to FIGS. 1 to 11.

Figure 1:
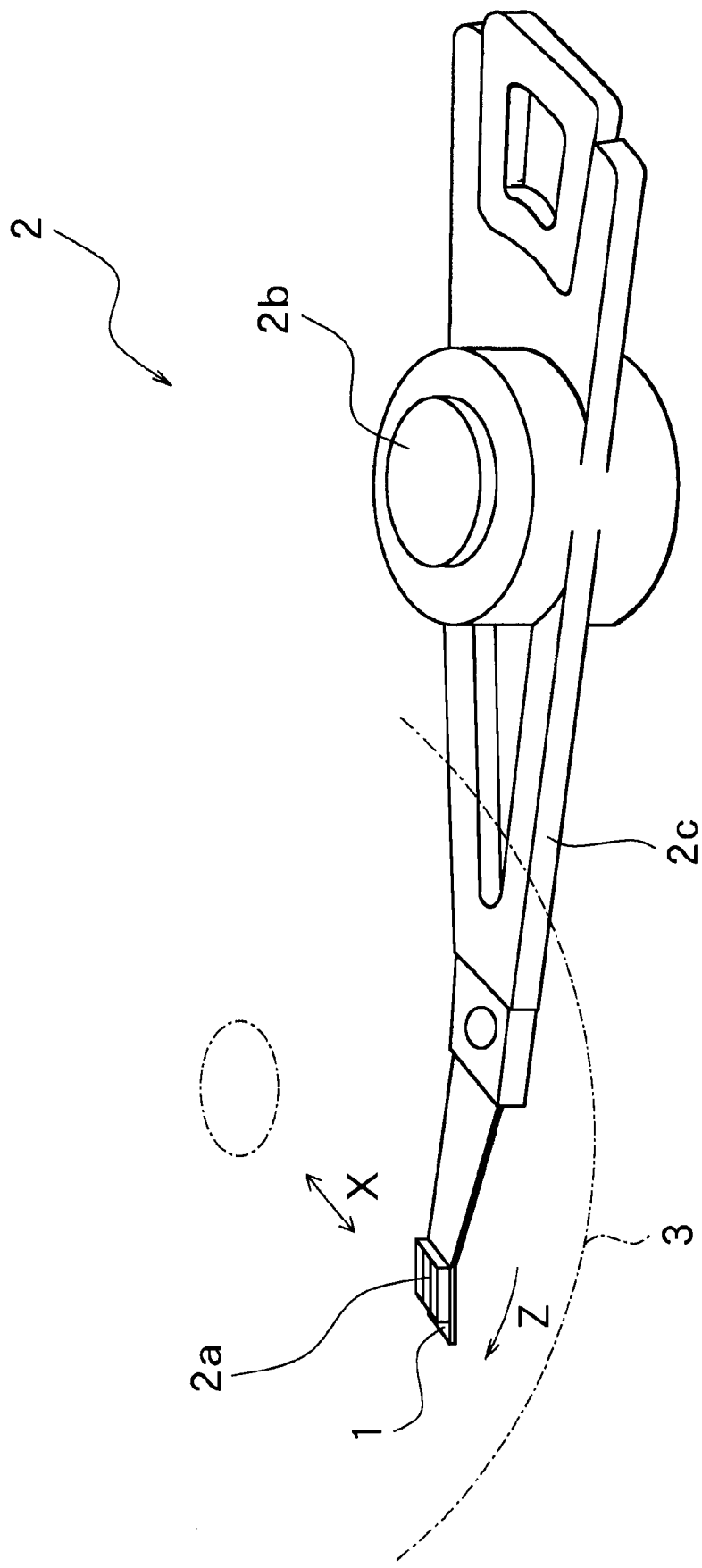
FIG. 1 is a perspective view of a configuration of an actuator arm comprising a thin film magnetic head including a magnetic transducer according to a first embodiment of the invention.

FIG. 1 shows the configuration of an actuator arm 2 comprising a thin film magnetic head 1 according to the embodiment. The actuator arm 2 is used in a hard disk drive (not shown) or the like, for example. The actuator arm 2 has a slider 2a on which the thin film magnetic head 1 is formed. For example, the slider 2a is mounted on the end of an arm 2c rotatably supported by a supporting pivot 2b. The arm 2c is rotated by a driving force of a voice coil motor (not shown), for example. Thus, the slider 2a moves in a direction x in which the slider 2a crosses a track line along a recording surface of a magnetic medium 3 such as a hard disk (a lower surface of the recording surface in FIG. 1). For example, the magnetic medium 3 rotates in a direction z substantially perpendicular to the direction x in which the slider 2a crosses the track line. The magnetic medium 3 rotates and the slider 2a moves in this manner, whereby information is recorded on the magnetic medium 3 or recorded information is read out from the magnetic medium 3.

Figure 2:
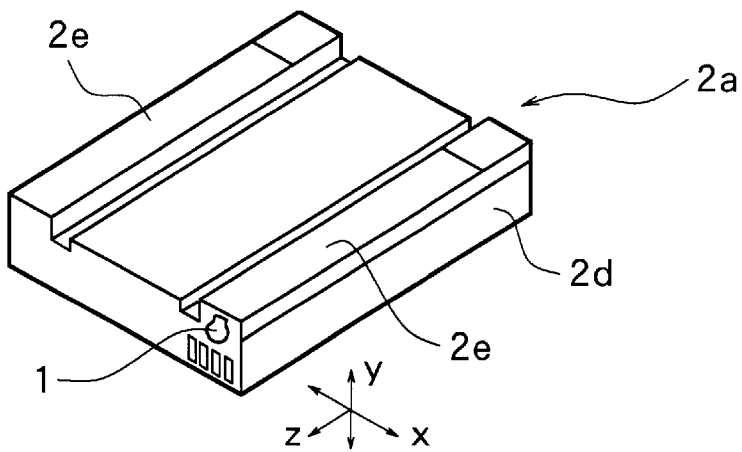
FIG. 2 is a perspective view of a configuration of a slider of the actuator arm shown in FIG. 1.

FIG. 2 shows the configuration of the slider 2a shown in FIG. 1. The slider 2a has a block-shaped base 2d made of $Al_2O_3$—TiC (altic), for example. The base 2d is substantially hexahedral, for instance. One face of the hexahedron closely faces the recording surface of the magnetic medium 3 (see FIG. 1). A surface facing the recording surface of the magnetic medium 3 is called an air bearing surface (ABS) 2e. When the magnetic medium 3 rotates, airflow generated between the recording surface of the magnetic medium 3 and the air bearing surface 2e allows the slider 2a to slightly move away from the recording surface in a direction y opposite to the recording surface. Thus, a constant distance is provided between the air bearing surface 2e and the magnetic medium 3. The thin film magnetic head 1 is formed on one side (the left side in FIG. 2) adjacent to the air bearing surface 2e of the base 2d.

Figure 3:
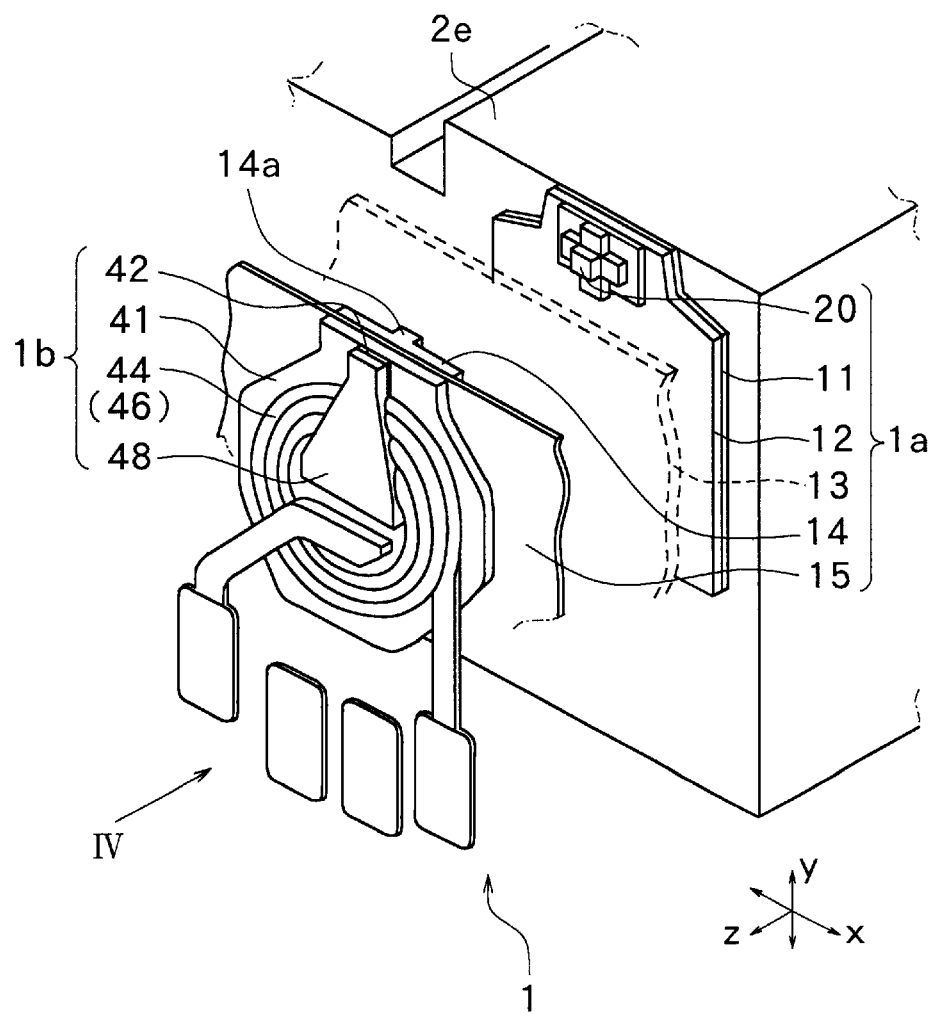
FIG. 3 is an exploded perspective view of a structure of the thin film magnetic head according to the first embodiment.
Figure 4:
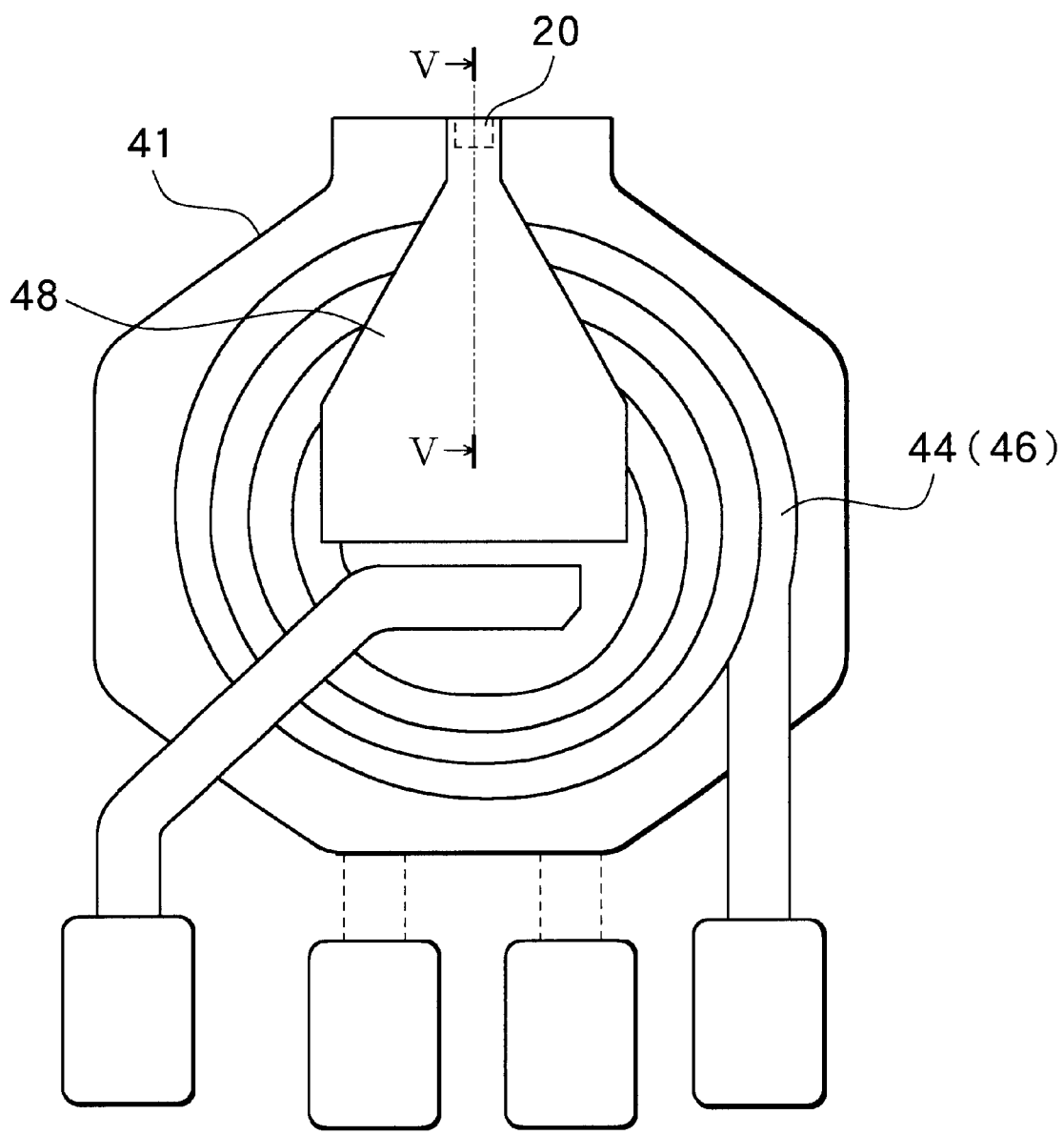
FIG. 4 is a plan view of a structure of the thin film magnetic head shown in FIG. 3 viewed from the direction of the arrow IV of FIG. 3.
Figure 5:
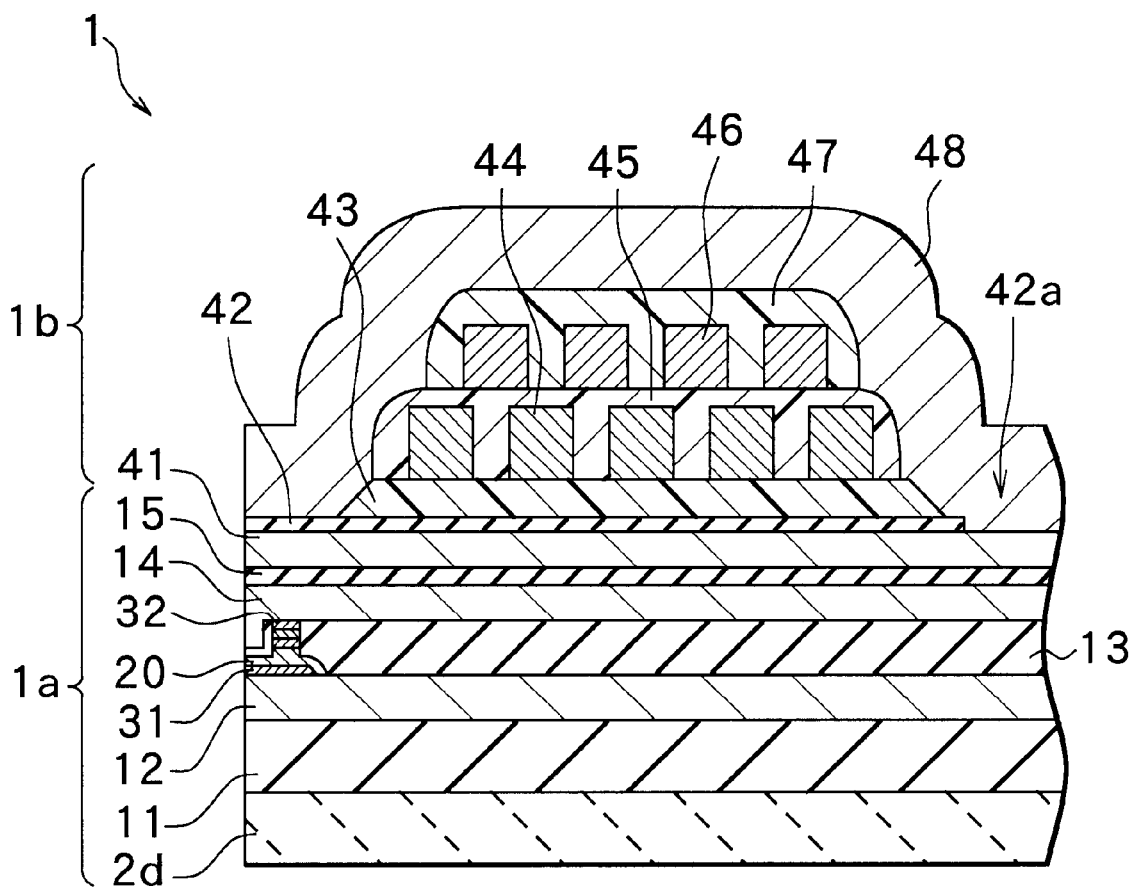
FIG. 5 is a sectional view of a structure of the thin film magnetic head shown in FIG. 3 viewed from the direction of the arrows along the line V—V of FIG. 4.

FIG. 3 is an exploded view of the structure of the thin film magnetic head 1. FIG. 4 shows a plan structure viewed from the direction of the arrow IV of FIG. 3. FIG. 5 shows a sectional structure viewed from the direction of the arrows along the line V—V of FIG. 4. The thin film magnetic head 1 has an integral structure comprising a reproducing head 1a for reproducing magnetic information recorded on the magnetic medium 3 and a recording head 1b for recording magnetic information on the track line of the magnetic medium 3.

As shown in FIGS. 3 and 5, for example, the reproducing head 1a has a stacked structure comprising an insulating layer 11, a first shield layer 12, an insulating layer 13, a second shield layer 14 and an insulating layer 15, which are stacked on the base 2d in this order. For example, the insulating layer 11 is 2 $\mu$m to 10 $\mu$m in thickness along the direction of stacking (hereinafter referred to as a thickness) and is made of $Al_2O_3$ (aluminum oxide). For example, each of the first and second shield layers 12 and 14 is 1 $\mu$m to 3 $\mu$m in thickness and is made of a magnetic metal material such as NiFe (nickel-iron alloy). The first and second shield layers 12 and 14 are layers for preventing an influence of an unnecessary magnetic field on a stack 20 to be described later. The first and second shield layers 12 and 14 also function as current paths for passing a current through the stack 20 in the direction of stack. For example, each of the insulating layers 13 and 15 is 10 nm to 100 nm in thickness and is made of $Al_2O_3$ or AlN (aluminum nitride). The insulating layer 13 is a layer for providing electrical insulation between the first shield layer 12 and the second shield layer 14. The insulating layer 15 is a layer for providing electrical insulation between the reproducing head 1a and the recording head 1b.

Figure 6:
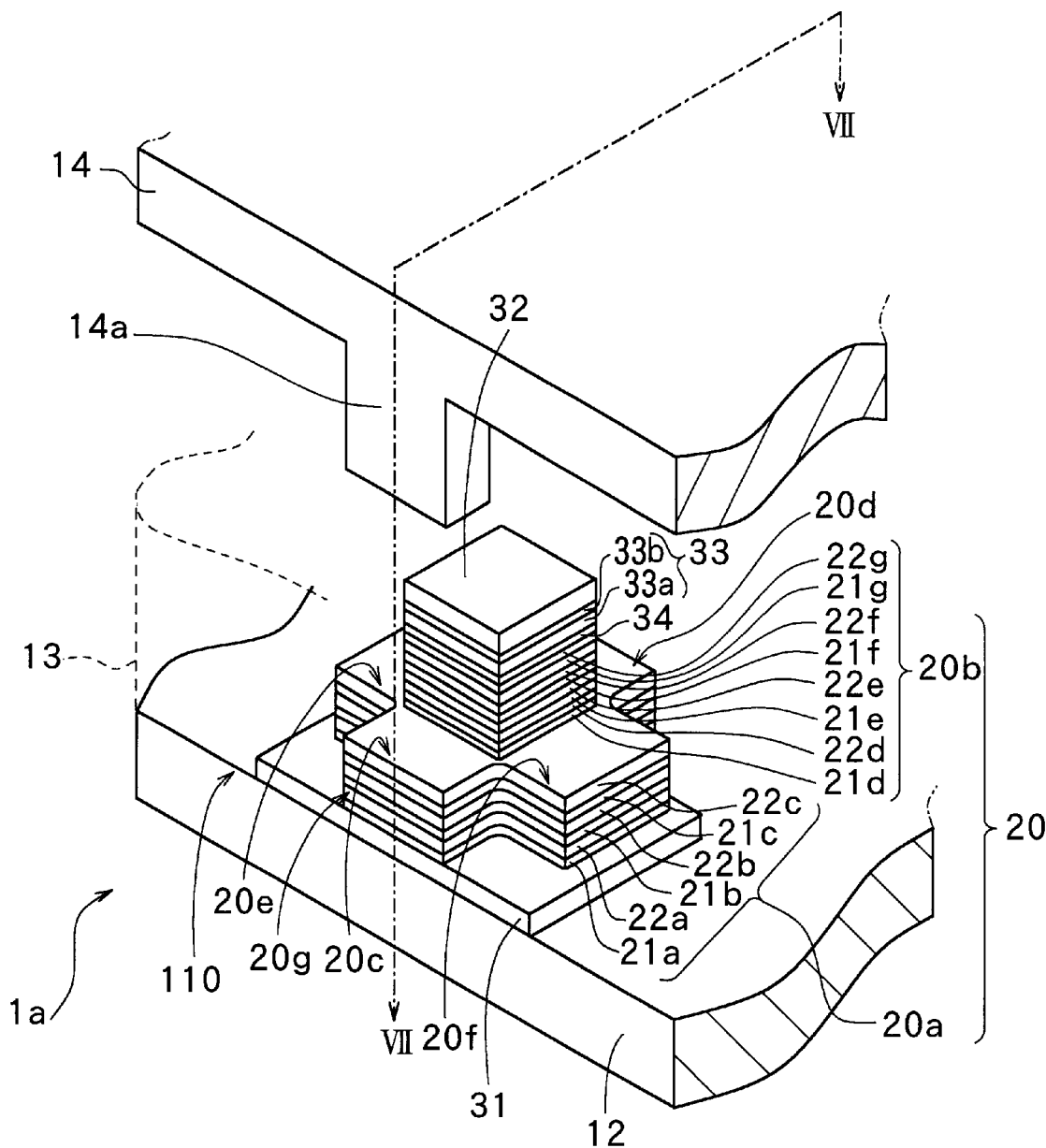
FIG. 6 is a perspective view of a general structure of the magnetic transducer of the thin film magnetic head shown in FIG. 5.
Figure 7:
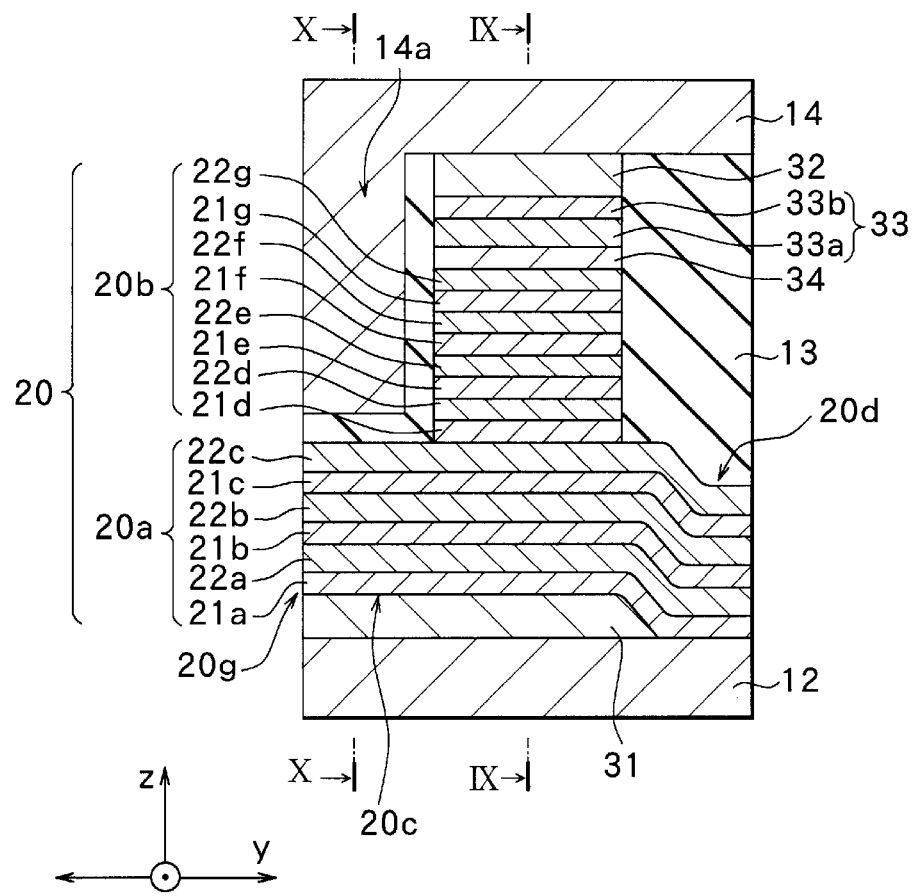
FIG. 7 is a sectional view of a sectional structure of the magnetic transducer shown in FIG. 6 viewed from the direction of the arrows along the line VII—VII of FIG. 6.
Figure 8:
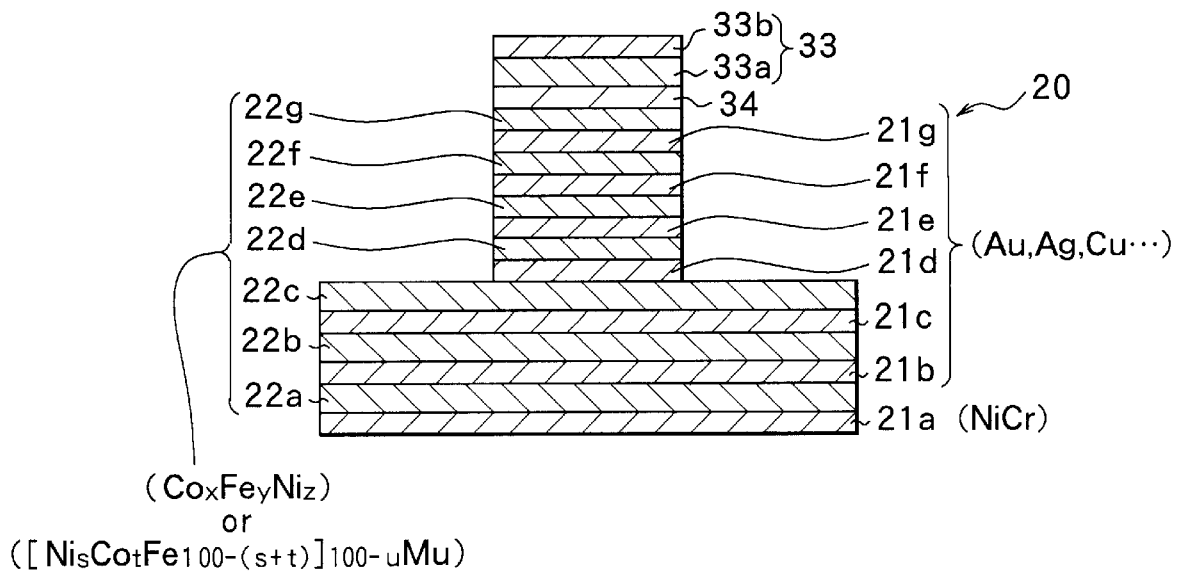
FIG. 8 is a sectional view of the magnetic transducer shown in FIG. 6.
Figure 9:
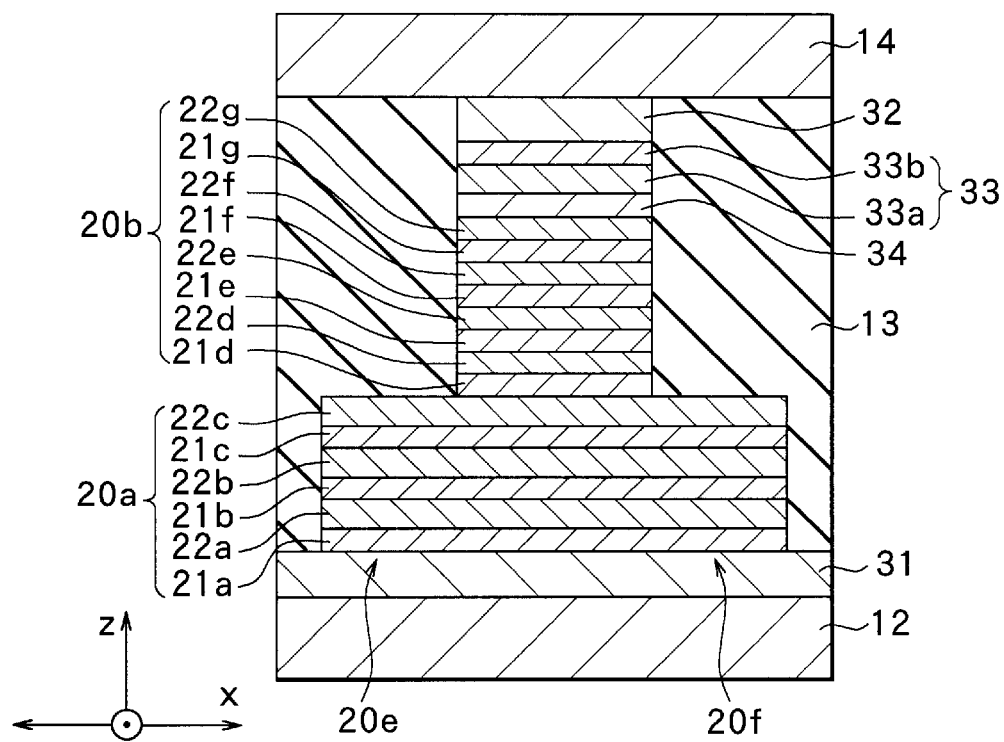
FIG. 9 is a sectional view of a sectional structure of the magnetic transducer shown in FIG. 7 viewed from the direction of the arrows along the line IX—IX of FIG. 7.
Figure 10:
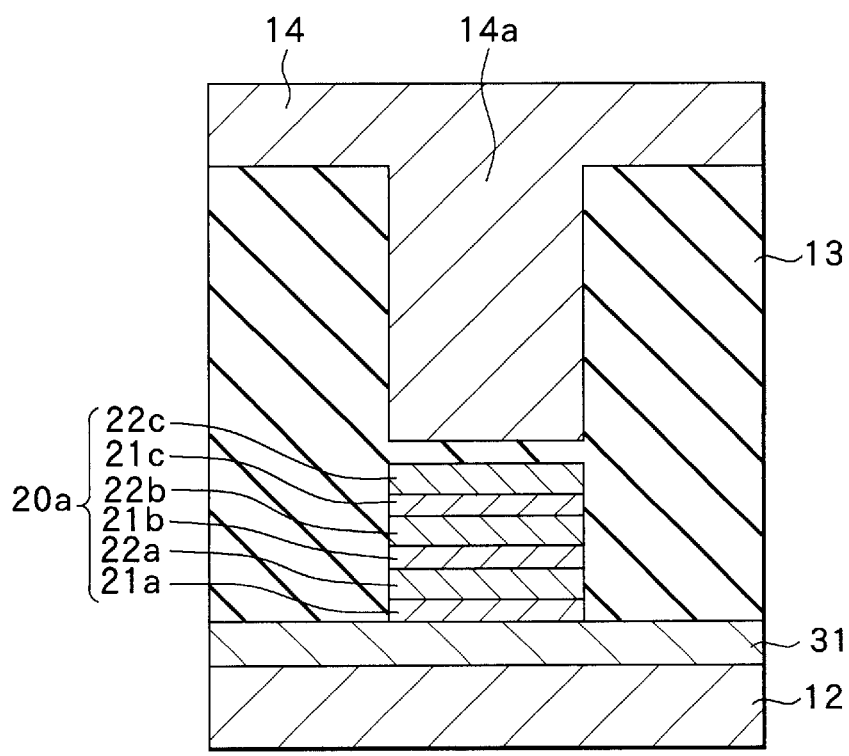
FIG. 10 is a sectional view of a sectional structure of the magnetic transducer shown in FIG. 7 viewed from the direction of the arrows along the line X—X of FIG. 7.

FIG. 6 is a schematic exploded view of the structure of the reproducing head 1a of the thin film magnetic head 1 shown in FIG. 3. FIG. 7 shows a sectional structure taken along the line VII—VII of FIG. 6. FIG. 8 shows only an MR element of the thin film magnetic head shown in FIG. 7. FIG. 9 shows a sectional structure viewed from the direction of the arrows along the line IX—IX of FIG. 7. FIG. 10 shows a sectional structure viewed from the direction of the arrows along the line X—X of FIG. 7. An MR element 110 including the stack 20 that is a multilayered type GMR film is formed between the first and second shield layers 12 and 14 close to the air bearing surface 2e with first and second gap layers 31 and 32 in between. For example, each of the first and second gap layers 31 and 32 is 2 nm to 30 nm in thickness and is made of a nonmagnetic metal material containing at least one element in a group including Ta, W, Ru, Pt, Re, Rh, Cr, Al, Cu, Au and Ag. The first and second gap layers 31 and 32 are layers for shielding magnetic coupling between the stack 20 and the first and second shield layers 12 and 14. Similarly to the first and second shield layers 12 and 14, the first and second gap layers 31 and 32 also function as the current paths for passing a current through the stack 20 in the direction of stacking.

As shown in FIG. 7, the stack 20 has a stacked structure comprising seven nonmagnetic layers 21a, 21b, 21c, 21d, 21e, 21f and 21g and seven magnetic layers 22a, 22b, 22c, 22d, 22e, 22f and 22g, in which the nonmagnetic and magnetic layers stacked alternately with each other in the direction in which the first and second gap layers 31 and 32 face each other.

In the stack 20, the orientations of magnetizations of the magnetic layers 22a to 22g are fixed by antiferromagnetic coupling between the magnetic layers adjacent to each other with the nonmagnetic layer in between. Preferably, antiferromagnetic coupling energy induced between two adjacent magnetic layers is $0.1 \times 10^{-4}$ $J/m^2$ to $2.0 \times 10^{-4}$ $J/m^2$, for example. Too weak antiferromagnetic coupling causes a low rate of resistance change. Too intense antiferromagnetic coupling causes little change in the orientation of magnetization under a signal magnetic field and thus results in low sensitivity. Under no signal magnetic field, an angle between the orientations of magnetizations of two adjacent ones of the magnetic layers 22a to 22g is preferably 90 deg or more, or more preferably from 100 deg to 260 deg inclusive.

Of the layers of the stack 20, the nonmagnetic layer 21a located closest to the first gap layer 31 is used as an underlayer on which the magnetic layers 22a to 22g and the other nonmagnetic layers 21b to 21g are to be formed. Hereinafter, the nonmagnetic layer 21a is referred to as an underlayer 21a.

As shown in FIG. 8, the underlayer 21a is made of a material containing Ni and Cr, for example. This can improve smoothness of interfaces between the magnetic layers 22a to 22g and the nonmagnetic layers 21b to 21g and can improve crystallizability of the magnetic layers 22a to 22g. Specifically, it is preferable that the underlayer 21a is made of $(Ni_aCr_{100-a})_bA_{100-b}$, where A denotes any metallic element other than Ni and Cr. Preferably, a and b are $40 \leq a \leq 75$ and $80 \leq b \leq 100$ in units of at %, respectively. a and b are within the above-mentioned ranges, whereby the interfaces between the nonmagnetic layers 21b to 21g and the magnetic layers 22a to 22g can be made smoother. The range of a is more preferably $50 \leq a \leq 70$, or most preferably $55 \leq a \leq 65$. Preferably, a thickness of the underlayer 21a is 1 nm to 10 nm. The thickness of the underlayer 21a is within the above-mentioned range, whereby thermal stability of the stack 20 improves and the rate of resistance change thereof increases.

Each of the nonmagnetic layers 21b to 21g is made of, for example, a material containing at least one element in a group including Au, Ag, Cu, Ru, Rh, Re, Pt and W, and the percentage of content of the at least one element is 60 at % or more. Preferably, the thickness of each of the nonmagnetic layers 21b to 21g is set so as to locally maximize the antiferromagnetic coupling energy induced between two adjacent ones of the magnetic layers 22a to 22g adjacent to each other with each of the nonmagnetic layers 21b to 21g in between. The antiferromagnetic coupling energy is locally maximized, whereby the angle between the orientations of magnetizations of two adjacent ones of the magnetic layers 22a to 22g can be about 180 deg and the rate of resistance change can be increased.

Figure 11:
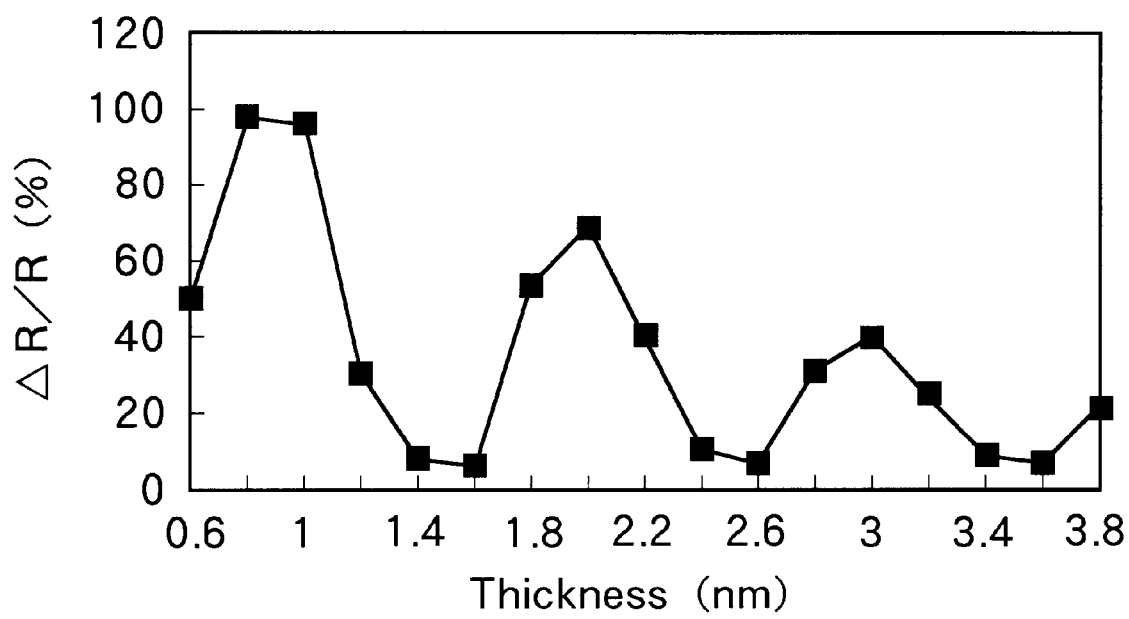
FIG. 11 is a plot of the correlation between the thickness of a nonmagnetic layer and the rate of resistance change.

FIG. 11 shows the correlation between the thickness of each of the nonmagnetic layers 21b to 21g and the rate $\Delta R/R$ of resistance change of the stack 20. FIG. 11 shows properties generally called RKKY (Ruderman-Kittel-Kasuya-Yoshida) interaction. FIG. 11 shows the case where the stack has a structure in which the number of magnetic layers is 20, each nonmagnetic layer is made of Cu, each magnetic layer is made of $Co_{80}Fe_{15}Ni_5$ and the thickness of the nonmagnetic layer is changed by every 0.2 nm within a range of from 0.6 nm to 3.8 nm. As shown in FIG. 11, the rate of resistance change takes on some maximum values in accordance with the thickness of the nonmagnetic layer. The correlation between the rate of resistance change and the thickness of the nonmagnetic layer corresponds to the correlation between the antiferromagnetic coupling energy induced between two adjacent magnetic layers and the thickness of the nonmagnetic layer. That is, when the rate of resistance change takes on the maximum value, the angle between the orientations of magnetizations of two adjacent magnetic layers is about 180 deg and the antiferromagnetic coupling energy also takes on the maximum value. In other words, the thickness of each of the nonmagnetic layers 21b to 21g is set so as to locally maximize the antiferromagnetic coupling energy, whereby the angle between the orientations of magnetizations of two adjacent ones of the magnetic layers 22a to 22g is about 180 deg and the rate of resistance change also increases.

As shown in FIG. 11, the rate of resistance change has a plurality of maximum values in accordance with the thickness of each of the nonmagnetic layers 21b to 21g. The thinner the nonmagnetic layers 21b to 21g are, the larger the maximum value is. In general, it is preferable that the thickness of each of the nonmagnetic layers 21b to 21g is set so as to correspond to the second largest maximum value. If the thickness of each of the nonmagnetic layers 21b to 21g is set so as to correspond to the largest maximum value, antiferromagnetic coupling between two adjacent ones of the magnetic layers 22a to 22g is too high and thus the sensitivity to the signal magnetic field decreases rather than increases. Specifically, it is preferable that the thickness of each of the nonmagnetic layers 21b to 21g is 1 nm to 3 nm.

As shown in FIG. 8, each of the magnetic layers 22a to 22g is made of, for example, a material containing at least Co in a group including Co, Fe and Ni. Specifically, it is preferable that each of the magnetic layers 22a to 22g is made of $Co_xFe_yNi_z$, where x, y and z are within a range of $10 \leq x \leq 80$, $0 \leq y \leq 25$ and $0 \leq z \leq 85$ in units of at %, respectively. The above-mentioned composition can increase the rate of resistance change of the stack 20 in particular. Each of the magnetic layers 22a to 22g may be made of a material containing at least Ni in a group including Ni, Co, Fe, Cr, Ta, Rh, Mo, Zr and Nb. Specifically, it is preferable that each of the magnetic layers 22a to 22g is made of $[Ni_sCo_tFe_{100-(s+t)}]_{100-u}M_u$, where M represents at least one of Cr, Ta, Rh, Mo, Zr and Nb, and s, t and u are $75 \leq s \leq 90$, $0 \leq t \leq 15$ and $0 \leq u \leq 15$ in units of at %, respectively. The above-mentioned composition can increase resistance of the stack 20 in particular.

Furthermore, each of the magnetic layers 22a to 22g may have a stacked structure comprising a plurality of layers differing from one another in material or composition. In this case, it is preferable that each of the magnetic layers 22a to 22g includes a nickel-containing layer containing at least Ni in a group including Ni, Co, Fe, Cr, Ta, Rh, Mo, Zr and Nb, and a cobalt-containing layer containing at least Co in a group including Co, Fe and Ni. Specifically, it is preferable that each of the magnetic layers 22a to 22g has a stacked structure comprising a cobalt-containing layer made of $Co_xFe_yNi_z$ and a nickel-containing layer numerical values (at %) indicated by reference symbols M, x, y, z, s, t and u are as described above. In this case, the magnetic layer may have a structure comprising two cobalt-containing layers and a nickel-containing layer sandwiched between the cobalt-containing layers. The above-mentioned structure can increase the resistance as well as the rate of resistance change.

Preferably, each of the magnetic layers 22a to 22g has (111) plane oriented in the direction of stacking. In the embodiment, the underlayer 21a is made of the above-mentioned material, whereby orientation of the (111) plane of each of the magnetic layers 22a to 22g can be improved.

Preferably, the thickness of each of the magnetic layers 22a to 22g is 1 nm to 6 nm. Although the number of magnetic layers is 7 in an example shown in FIGS. 6 to 10, it is preferable that the number of magnetic layers is within a range of from 2 to 20. When the number of magnetic layers is more than 20, the overall stack 20 becomes too thick and thus the orientations of magnetizations of the magnetic layers vary greatly. When the number of magnetic layers is less than 2, the rate of resistance change cannot be sufficiently increased.

As shown in FIGS. 6 to 10, for example, the stack 20 is divided into a first region 20a and a second region 20b in the direction of stacking. For example, the first region 20a comprises six layers (the underlayer 21a, the magnetic layers 22a to 22c and the nonmagnetic layers 21b and 21c) close to the base 2d, while the second region 20b comprises the remaining eight layers (the magnetic layers 22d to 22g and the nonmagnetic layers 21d to 21g). The number of magnetic layers of each of the first and second regions 20a and 20b has been specifically described above. However, it is preferable that the number of magnetic layers of the first region 20a is from 1 to 10 inclusive and the number of magnetic layers of the second region 20b is from 1 to 10 inclusive. The thickness of the first region 20a is 6 nm to 15 nm, for example. The thickness of the second region 20b is 6 nm to 30 nm, for example.

For example, the first region 20a is substantially cross-shaped on the first shield layer 12. For example, the second region 20b is shaped into a general rectangular parallelepiped on about the center of the first region 20a. For instance, the first region 20a has a projecting portion 20c projecting closer to the air bearing surface 2e, i.e., closer to the magnetic medium 3 located on the side of a signal magnetic field capturing portion, than the second region 20b; an extending portion 20d extending in the direction opposite to the projecting portion 20c; and a pair of wide portions 20e and 20f widened in the direction perpendicular to the direction in which the extending portion 20d extends.

For example, an end surface 20g of the projecting portion 20c extends to the air bearing surface 2e, is exposed to the outside and faces the magnetic medium 3. Thus, the projecting portion 20c functions as a magnetic field capturing portion for capturing the signal magnetic field of the magnetic medium 3. Preferably, a length of the projecting portion 20c along the projecting direction thereof, i.e., a distance between the end surface 20g and the second region 20b is 0.1 μm or less, for example. When the length is more than 0.1 μm, it is difficult to capture the signal magnetic field. As a result, output decreases.

For example, the extending portion 20d extends longer than the first gap layer 31, and the end thereof is in contact with the first shield layer 12. The length of the underlayer 21a in the extending portion 20d is shorter than those of the other five layers (the magnetic layers 22a to 22c and the nonmagnetic layers 21b and 21c). Thus, the magnetic layer 22a is in contact with the first shield layer 12. That is, the stack 20 is magnetically coupled to the first shield layer 12 in the extending portion 20d, whereby the signal magnetic field can be more easily captured. Preferably, the length of the extending portion 20d along the extending direction thereof is 0.1 μm or less, for example. If the length is longer than 0.1 μm, an effect of facilitating capturing the signal magnetic field decreases.

As shown in FIG. 7, a magnetic field capture limiting portion 14a of the second shield layer 14 is provided on the side of the second region 20b close to the air bearing surface 2e with the insulating layer 13 in between. The magnetic field capture limiting portion 14a is formed of an extending and projecting part of the second shield layer 14. The magnetic field capture limiting portion 14a covers the nearly overall surface of the side of the second region 20b close to the air bearing surface 2e, thereby limiting an effect of the signal magnetic field by the side of the second region 20b close to the air bearing surface 2e. That is, the magnetic field capture limiting portion 14a prevents the second region 20b from directly capturing the signal magnetic field of the magnetic medium 3 and thus allows the second region 20b to receive the signal magnetic field captured via the first region 20a. Thus, in the stack 20, the thickness of the first region 20a functioning as the magnetic field capturing portion is reduced, and the thickness of the overall stack 20 is increased. Therefore, the rate of resistance change and the resistance can be increased. The magnetic field capture limiting portion 14a is made of, for example, a magnetic material such as NiFe similarly to the second shield layer 14. The insulating layer 13 is interposed between the magnetic field capture limiting portion 14a and the projecting portion 20c of the first region 20a. The distance between the magnetic field capture limiting portion 14a and the projecting portion 20c is 0.5 nm to 5 nm, for example. The insulating layer 13 has facilities for not only ensuring electrical insulation between the second shield layer 14 and the stack 20 but also shielding magnetic coupling between the second shield layer 14 and the stack 20.

A layer 33 having the fixed orientation of magnetization having magnetization fixed in a constant direction is provided between the stack 20 and the second gap layer 32. An inserted layer 34 is inserted between the layer 33 and the stack 20.

The layer 33 includes an exchange coupling layer 33a stacked on the stack 20, and an antiferromagnetic layer 33b formed on the exchange coupling layer 33a. The layer 33 functions as a magnetic field applying layer for applying a fixed magnetic field to at least the magnetic layer 22g (the layer closest to the layer 33) of the stack 20 and thus functions as a magnetic domain control layer for controlling the orientations of magnetizations of the magnetic layers 22a to 22g and thereby preventing Barkhausen noise. The magnetic field generated by the layer 33 is sometimes called a bias magnetic field.

For example, the exchange coupling layer 33a is 3 nm to 30 nm in thickness and is made of a magnetic material containing Fe, Co and Ni. The orientation of magnetization of the exchange coupling layer 33a is fixed by exchange coupling on the interface between the exchange coupling layer 33a and the antiferromagnetic layer 33b.

For example, the antiferromagnetic layer 33b is 5 nm to 20 nm in thickness and is made of an antiferromagnetic material containing at least one element $M_{II}$ in a group including Pt, Ru, Rh, Pd, Ni, Au, Ag, Cu, Ir, Cr and Fe, and Mn. Preferably, the percentage of content of Mn is from 45 at % to 95 at % inclusive, and the percentage of content of the other element $M_{II}$ is from 5 at % to 65 at % inclusive. Antiferromagnetic materials include a non-heat-treatment type antiferromagnetic material which exhibits antiferromagnetism even without heat treatment and induces an exchange coupling magnetic field between the antiferromagnetic material and a ferromagnetic material, and a heat-treatment type antiferromagnetic material which exhibits antiferromagnetism by heat treatment. The antiferromagnetic layer 33b may be made of either the non-heat-treatment type antiferromagnetic material or the heat-treatment type antiferromagnetic material. Non-heat-treatment type antiferromagnetic materials include Mn alloy having γ-phase, and so on. Specifically, RuRhMn (ruthenium-rhodium-manganese alloy), FeMn (iron-manganese alloy), IrMn (iridium-manganese alloy) and the like are included. Heat-treatment type antiferromagnetic materials include Mn alloy having regular crystal structures, and so on. Specifically, PtMn (platinum-manganese alloy), NiMn (nickel-manganese alloy), PtRhMn (platinum-rhodium-manganese alloy) and the like are included.

The layer 33 may be made of a hard magnetic material (the so-called permanent magnet) such as CoPt (cobalt-platinum alloy) or CoPtCr (cobalt-platinum-chromium alloy). However, it is more preferable that the layer 33 is made of the exchange coupling layer 33a and the antiferromagnetic layer 33b because it can appropriately control the strength of the magnetic field to be applied to the magnetic layers 22a to 22g of the stack 20. Moreover, the use of the exchange coupling layer 33a and the antiferromagnetic layer 33b has an advantage of being able to obtain an appropriate strength of the magnetic field even if the thickness of the exchange coupling layer 33a and the antiferromagnetic layer 33b is thinner than that of the hard magnetic material.

The inserted layer 34 is a layer for shielding magnetic coupling between the layer 33 and the stack 20 and thereby controlling the intensity of the magnetic field of the layer 33 to be applied to the stack 20. The inserted layer 34 is made of, for example, a nonmagnetic material containing at least one element in a group including Au, Ag, Cu, Ru, Rh, Re, Pt and W, and the percentage of content of the at least one element is 60 at % or more. The thickness of the inserted layer 34 is controlled in accordance with the strength of the magnetic field of the layer 33 to be applied to the stack 20. Preferably, the thickness of the inserted layer 34 is 1 nm to 10 nm, for example.

For example, as shown in FIGS. 3 and 5, the recording head 1b has a bottom pole 41 of 0.5 μm to 3 μm thick made of a magnetic material such as NiFe on the insulating layer 15 of the reproducing head 1a. A write gap layer 42 of 0.05 μm to 0.3 μm thick made of an insulating film such as $Al_2O_3$ is formed on the bottom pole 41. The write gap layer 42 has an opening 42a at the position corresponding to the center of thin film coils 44 and 46 to be described later. An insulating layer 43 made of $Al_2O_3$ or the like and having a thickness of 1.0 μm to 5.0 μm for determining a throat height is formed on the write gap layer 42. The thin film coils 44 of 1 μm to 3 μm thick and a photoresist layer 45 for coating the thin film coils 44 are formed on the insulating layer 43. The thin film coils 46 of 1 μm to 3 μm thick and a photoresist layer 47 for coating the thin film coils 46 are formed on the photoresist layer 45. In the embodiment, the description is given with regard to an example in which two thin film coil layers are stacked. However, the number of thin film coil layers may be one, or three or more.

A top pole 48 of about 3 μm thick made of a magnetic material having high saturation magnetic flux density, such as NiFe or FeN (iron nitride), is formed on the write gap layer 42, the insulating layer 43 and the photoresist layers 45 and 47. The top pole 48 is in contact with and magnetically coupled to the bottom pole 41 through the opening 42a of the write gap layer 42 located at the position corresponding to the center of the thin film coils 44 and 46. Although not shown in FIGS. 3 to 5, an overcoat layer (an overcoat layer 49 shown in FIG. 15) of 20 μm to 30 μm thick made of, for example, $Al_2O_3$ is formed on the top pole 48 so as to coat the overall surface. In the embodiment, a stacking structure from the bottom pole 41 to the overcoat layer corresponds to the recording head 1b. The recording head 1b generates a magnetic flux between the bottom pole 41 and the top pole 48 by a current passing through the thin film coils 44 and 46 and magnetizes the magnetic medium 3 by the magnetic flux generated near the write gap layer 42, thereby recording information.

<Operation of MR Element and Thin Film Magnetic Head>

Next, a reproducing operation of the MR element 110 and the thin film magnetic head 1 having the above-described structures will be described with reference to FIGS. 6, 7 12A and 12B.

Figure 12A:
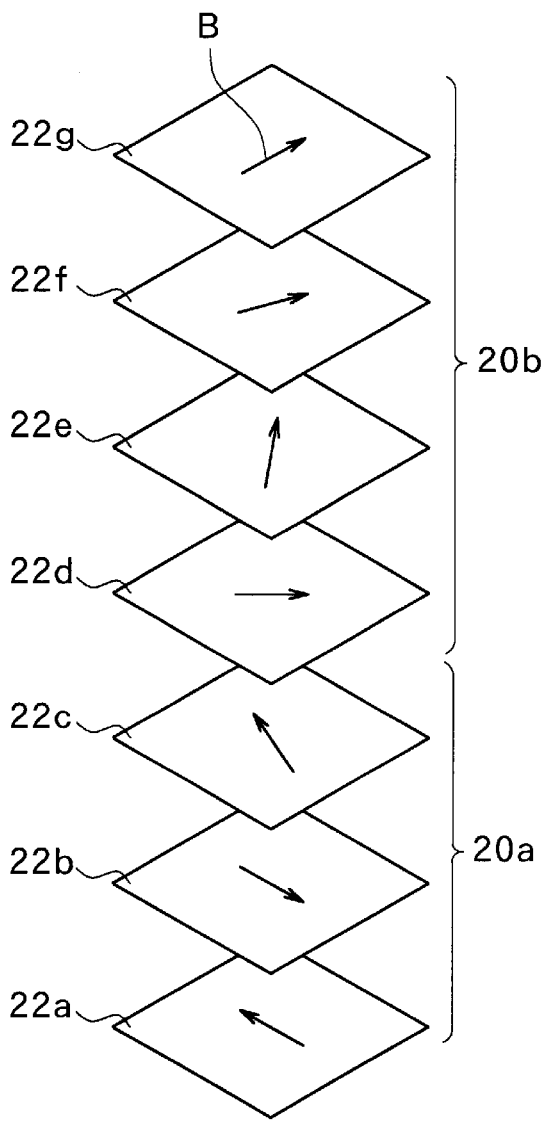
FIGS. 12A and 12B are illustrations of the orientations of magnetizations of magnetic layers of a stack of the thin film magnetic head shown in FIG. 7.

In the thin film magnetic head 1, information recorded on the magnetic medium 3 is read out by the reproducing head 1a. FIG. 12A is an illustration of the orientations of magnetizations of the magnetic layers 22a to 22g in the case where the signal magnetic field is not applied to the stack 20 of the reproducing head 1a. In this case, a single magnetic domain is formed in the uppermost magnetic layer 22g by the magnetic field generated by the layer 33 (that is, the orientations of magnetizations in the layer are oriented in a substantially fixed direction), and thus the orientation of magnetization of the magnetic layer 22g is perpendicular to the air bearing surface as shown by the arrow B in FIG. 12A. When the magnetic layer 22g is changed into the single magnetic domain, each of the other magnetic layers 22a to 22f is changed into the single magnetic domain by antiferromagnetic coupling between the magnetic layers adjacent to each other with the nonmagnetic layer in between. The layer 33 has the stronger influence on a place closer to the layer 33. Thus, the orientations of magnetizations of the magnetic layers 22a to 22g become closer to the direction of the arrow B. On the other hand, the layer 33 has the weaker influence on a place farther from the layer 33. Thus, the orientations of magnetizations of the adjacent magnetic layers 22a to 22g are oriented at about 180 deg because of antiferromagnetic coupling between the magnetic layers.

In reading out information, a current is passed through the stack 20 in the direction of stacking through the first shield layer 12 and the second shield layer 14. The current passes through the first shield layer 12, the first gap layer 31, the stack 20, the inserted layer 34, the layer 33, the second gap layer 32 and the second shield layer 14 in this order, or the current passes in reverse order.

When the signal magnetic field is applied to the stack 20, the signal magnetic field is captured by the projecting portion 20c and reaches the second region 20b.

Figure 12B:
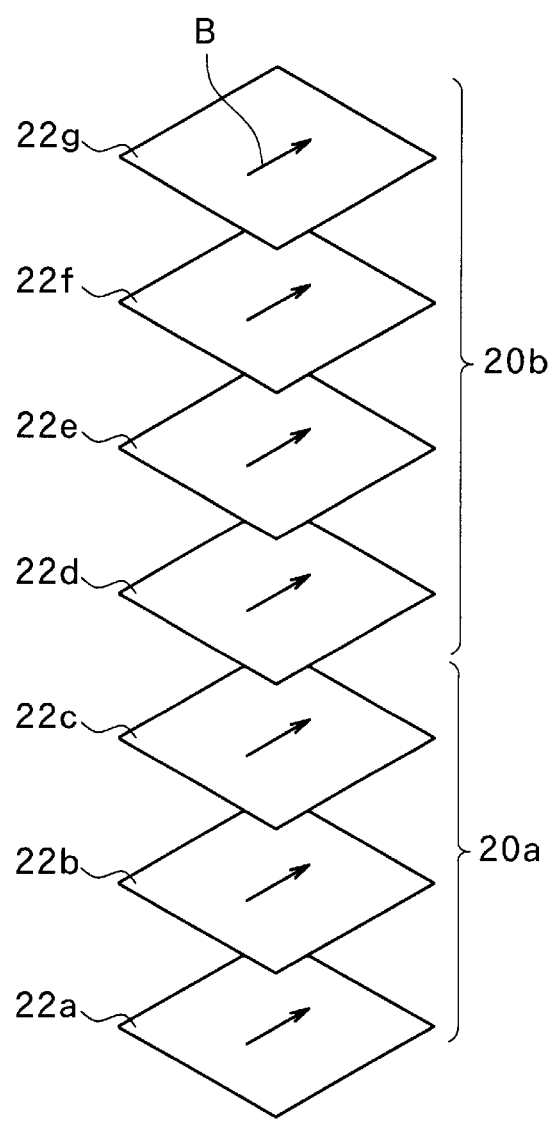

FIG. 12B is an illustration of the orientations of magnetizations of the magnetic layers 22a to 22g in the case where the signal magnetic field is applied to the stack 20. In stack 20, the orientations of magnetizations of the magnetic layers 22a to 22c of the first region 20a having the projecting portion 20c are greatly changed from a state shown in FIG. 12A to a state shown in FIG. 12B by the signal magnetic field. On the other hand, in the second region 20b, the influence of the signal magnetic field becomes weak, and the influence of the layer 33 becomes strong. Thus, the signal magnetic field causes a relatively little change in the orientations of magnetizations.

The above-described change in the orientations of magnetizations of the magnetic layers 22a to 22g of the stack 20 causes a change in electrical resistance of the stack 20. The change in electrical resistance is detected as the amount of change in voltage between the first shield layer 12 and the second shield layer 14. Thus, the signal magnetic field of the magnetic medium 3 is detected, and therefore recorded information is read out from the magnetic medium 3.

The layer 33 promotes changing the magnetic layers 22a to 22g into the single magnetic domain. Thus, Barkhausen noise is prevented, and therefore good output can be obtained.

<Method of Manufacturing MR Element and Thin Film Magnetic Head>

Next, a method of manufacturing the MR element 110 and the thin film magnetic head 1 will be briefly described with reference to FIG. 6 and FIGS. 13A–13C through 16. FIGS. 13A–13C through 16 show a sectional structure in the same cross section as a cross section taken along the line VII—VII of FIG. 6.

Figure 13A:
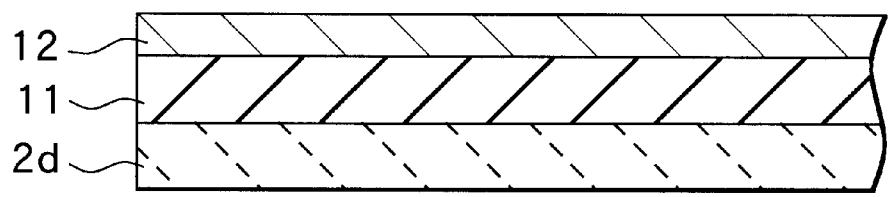
FIGS. 13A to 13C are sectional views for describing a step of a method of manufacturing the thin film magnetic head shown in FIG. 7.
Figure 13B:
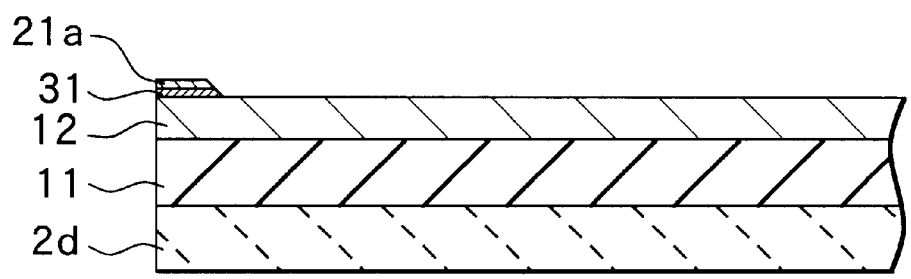

In the method of manufacturing according to the embodiment, first, as shown in FIG. 13A, for example, the insulating layer 11 is formed on one side of the base 2d made of Al$_2$O$_3$—TiC by sputtering using the material mentioned in the description of the structure. Then, the first shield layer 12 is formed on the insulating layer 11 by, for example, plating using the material mentioned in the description of the structure. Subsequently, as shown in FIG. 13B, for example, the first gap layer 31 and the underlayer 21a are deposited in sequence on the side of the first shield layer 12 close to the air bearing surface by sputtering using the material mentioned in the description of the structure. Then, the first gap layer 31 and the underlayer 21a are patterned by photolithography and electron beam lithography using, for example, i-rays, KrF (krypton fluoride), ArF (argon fluoride) or the like.

Figure 13C:
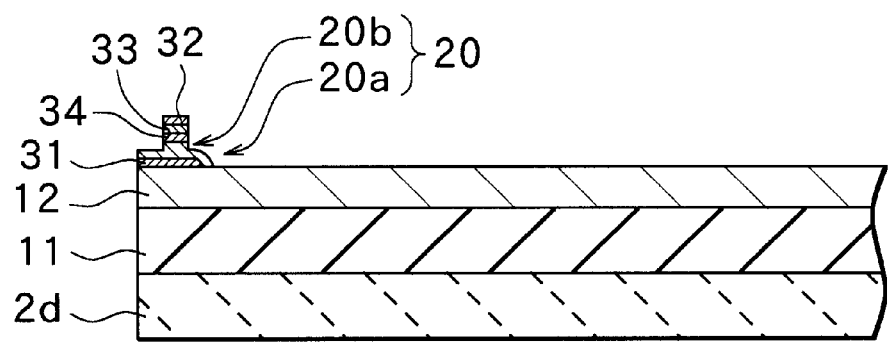

After patterning the first gap layer 31 and the underlayer 21a, as shown in FIG. 13C, the magnetic layers 22a to 22g and the nonmagnetic layers 21b to 21g are alternately deposited on the first gap layer 31 by sputtering, for example. Then, the inserted layer 34, the exchange coupling layer 33a, the antiferromagnetic layer 33b and the second gap layer 32 are deposited in sequence on the magnetic layer 22g. The respective materials of the magnetic layer, the nonmagnetic layer, the inserted layer 34, the exchange coupling layer 33a, the antiferromagnetic layer 33b and the second gap layer 32 are as mentioned in the description of the structure. After that, a resist mask of a predetermined pattern is formed by, for example, electron beam lithography, and milling is performed by, for example, ion milling. The first region 20a, the second region 20b, the inserted layer 34, the exchange coupling layer 33a, the antiferromagnetic layer 33b and the second gap layer 32 are formed by controlling a depth of milling. Since the layer 33 is formed on the stack 20, a manufacturing process is simplified as compared to the case in which the layer 33 is formed on both sides of the stack 20.

Figure 14A:
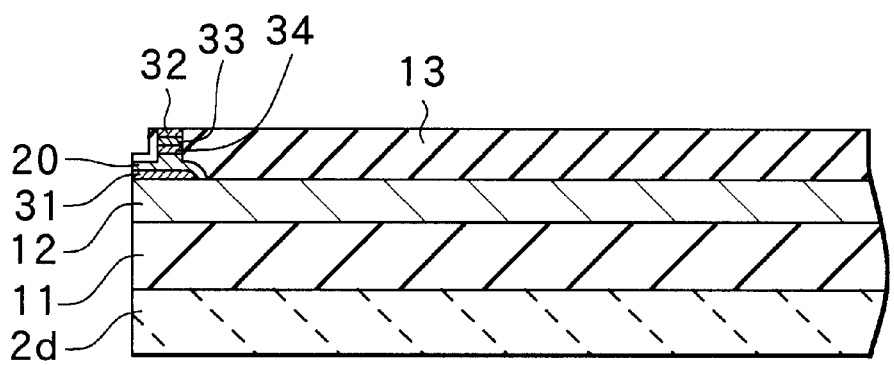
FIGS. 14A and 14B are sectional views for describing a step following the step of FIGS. 13A to 13C.

After forming the second gap layer 32, as shown in FIG. 14A, the insulating layer 13 is selectively formed by, for example, sputtering using the material mentioned in the description of the structure so as to cover the surface of the first shield layer 12, the stack 20 and the layer 33 and to expose the surface of the second gap layer 32.

Figure 14B:
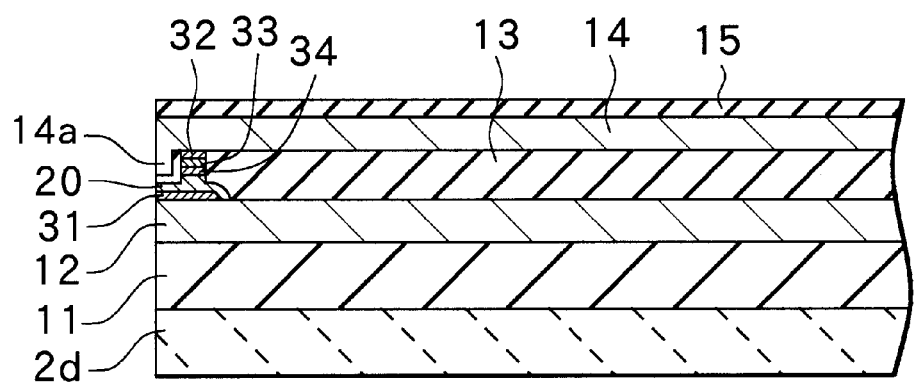
Figure 15A:
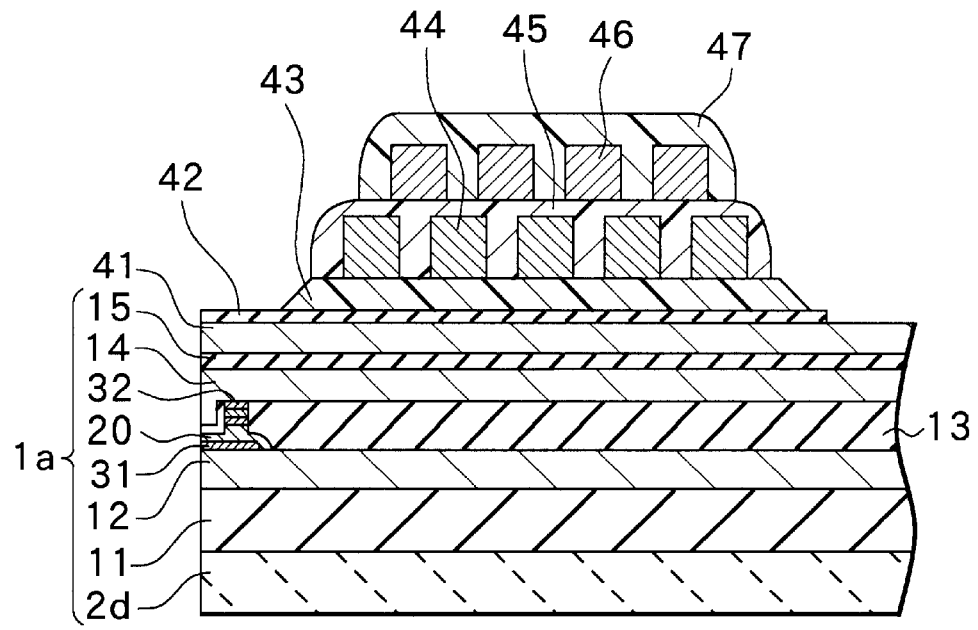
FIGS. 15A and 15B are sectional views for describing a step following the step of FIGS. 14A and 14B.

After forming the insulating layer 13, for example, as shown in FIG. 14B, the second shield layer 14 is deposited on the insulating layer 13 by, for example, sputtering using the material mentioned in the description of the structure. At this time, the deposition of the second shield layer 14 fills in a recess naturally formed at the time of forming the insulating layer 13. Thus, the recess filled with the second shield layer 14 is the magnetic field capture limiting portion 14a. After that, the insulating layer 15 is deposited on the second shield layer 14 by, for example, sputtering using the material mentioned in the description of the structure. After forming the insulating layer 15, as shown in FIG. 15A, the bottom pole 41 is deposited on the insulating layer 15 by, for example, sputtering using the material mentioned in the description of the structure. Then, the write gap layer 42 is formed on the bottom pole 41 by sputtering, for example. Then, the insulating layer 43 is formed into a predetermined pattern on the write gap layer 42. After forming the insulating layer 43, the thin film coils 44 are formed on the insulating layer 43 by using the material mentioned in the description of the structure. Then, the photoresist layer 45 is formed into a predetermined pattern so as to coat the thin film coils 44. After forming the photoresist layer 45, the thin film coils 46 are formed on the photoresist layer 45 by using the material mentioned in the description of the structure. Then, the photoresist layer 47 is formed into a predetermined pattern so as to coat the thin film coils 46.

Figure 15B:
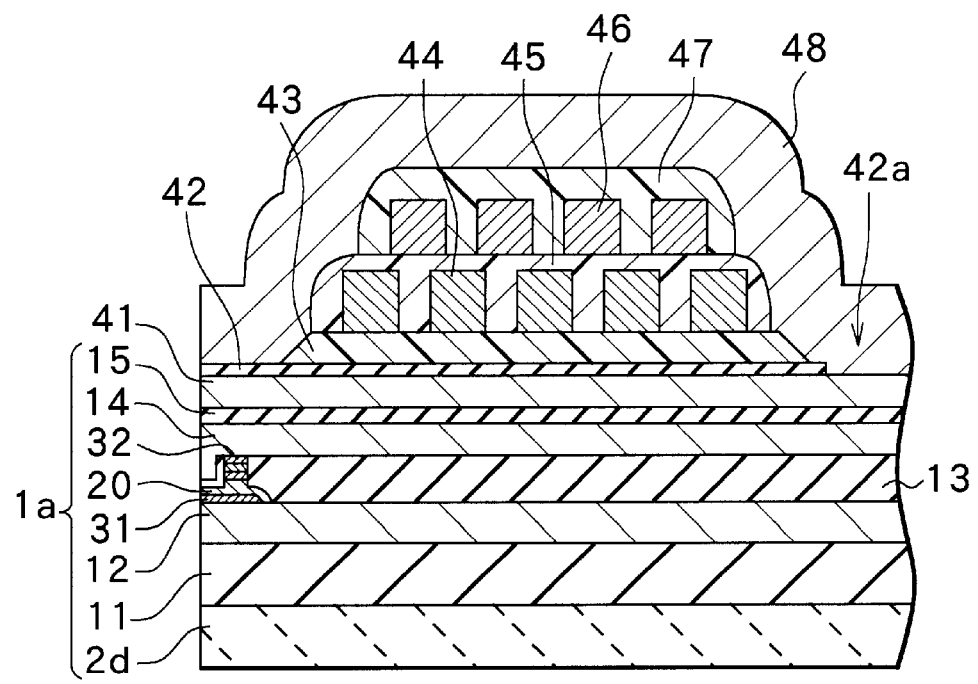
Figure 16:
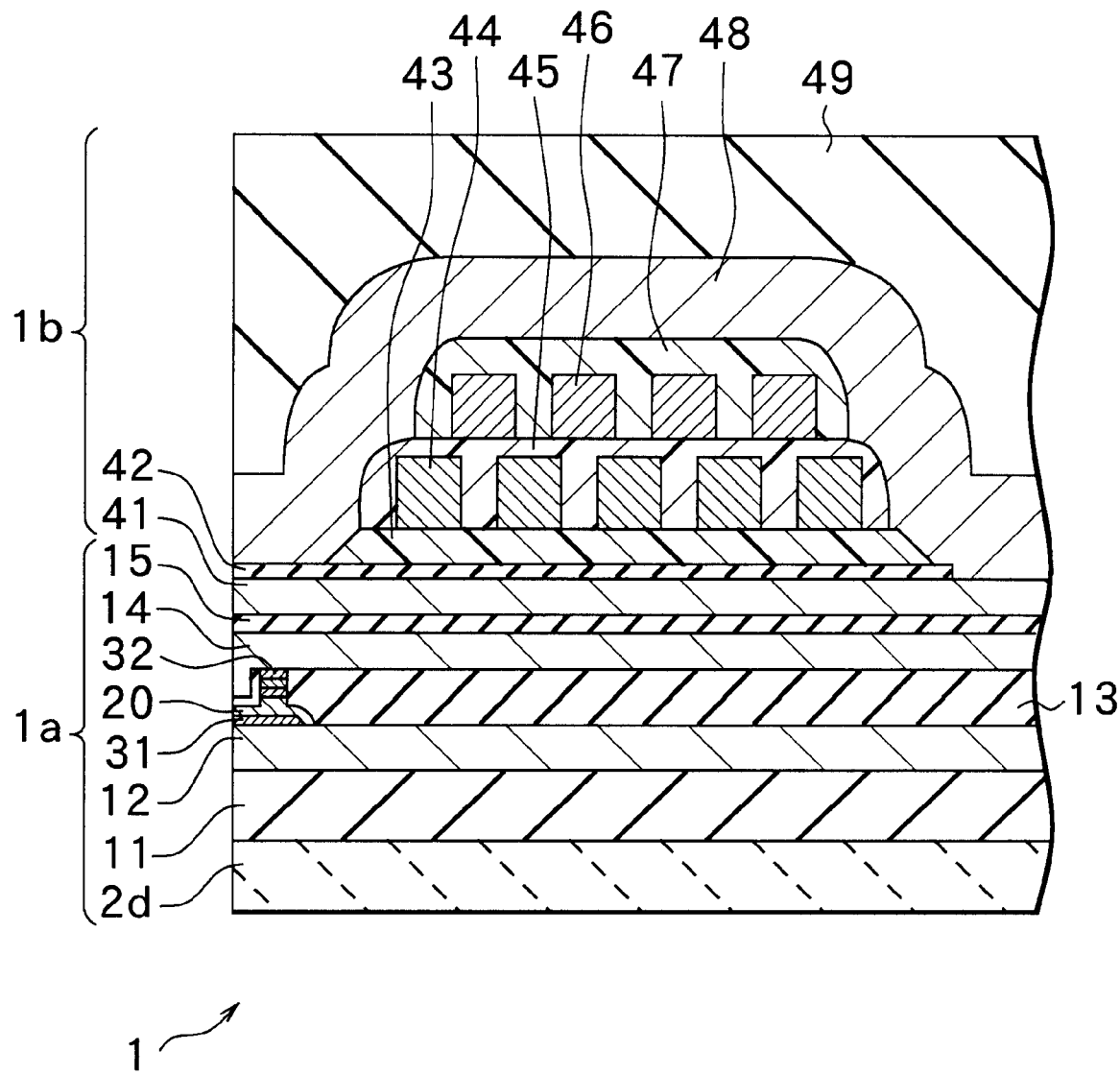
FIG. 16 is a sectional view for describing a step following the step of FIGS. 15A and 15B.

After forming the photoresist layer 47, as shown in FIG. 15B, for example, the write gap layer 42 is partially etched at the position corresponding to the center of the thin film coils 44 and 46, whereby the opening 42a for forming a magnetic path is formed. After that, for example, the top pole 48 is formed on the write gap layer 42, the opening 42a, the insulating layer 43 and the photoresist layers 45 and 47 by using the material mentioned in the description of the structure. After forming the top pole 48, for example, the write gap layer 42 and the bottom pole 41 are selectively etched by ion milling using the top pole 48 as a mask. After that, as shown in FIG. 16, the overcoat layer 49 is formed on the top pole 48 by using the material mentioned in the description of the structure. Finally, for example, the air bearing surface is formed by machining the slider 2a. As a result, the thin film magnetic head 1 is completed.

When the antiferromagnetic layer 33b of the layer 33 is made of the heat-treatment type antiferromagnetic material, heat treatment takes place in order to induce exchange coupling between the antiferromagnetic layer 33b and the exchange coupling layer 33a. Specifically, the thin film magnetic head 1 is heated at about 200° C. to 300° C. for 1 hour to 5 hours with the magnetic field applied in a fixed direction by utilizing a magnetic field generating apparatus or the like, for example. Thus, the orientation of magnetization of the exchange coupling layer 33a is fixed in the direction of the applied magnetic field. On the other hand, when the antiferromagnetic layer 33b is made of the non-heat-treatment type antiferromagnetic material, heat treatment for the heat-treatment type antiferromagnetic material is unnecessary. In this case, the antiferromagnetic layer 33b is deposited with the magnetic field applied in a predetermined direction, whereby the magnetization of the exchange coupling layer 33a is fixed in the direction of the applied magnetic field.

Effects of First Embodiment

As described above, according to the embodiment, the layer 33 changes the magnetic layers 22a to 22g of the stack 20 into the single magnetic domain. Thus, Barkhausen noise is prevented, and therefore good output can be obtained. Furthermore, the layer 33 is formed on the stack 20. Thus, the manufacturing process is simplified as compared to the case in which the layer 33 is formed on both sides of the stack 20. Moreover, it is not necessary to interpose the insulating layer or the like between the layer 33 and the stack 20. Thus, the magnetic layers 22a to 22g can be sufficiently changed into the single magnetic domain. Therefore, Barkhausen noise can be more reliably prevented.

Furthermore, the layer 33 comprises the antiferromagnetic layer 33b and the exchange coupling layer 33a, whereby it is possible to appropriately control the strength of the magnetic field to be applied to the magnetic layers 22a to 22g of the stack 20.

Moreover, the layer 33 is located away from the projecting portion 20c for capturing the signal magnetic field in the direction of stacking, whereby it is possible to prevent excessive limitations on a change in the orientations of magnetizations of the magnetic layers.

Moreover, the antiferromagnetic layer 33b is made of a material containing at least one element in a group including Pt, Ru, Rh, Pd, Ni, Au, Ag, Cu, Ir, Cr and Fe and Mn, or the exchange coupling layer 33a is made of a material containing at least one element in a group including Fe, Co and Ni. Thus, an appropriate magnetic field is generated, and therefore the orientations of magnetizations of the magnetic layers 22a to 22g can be reliably controlled.

Furthermore, the inserted layer 34 is located between the layer 33 and the stack 20, whereby it is possible to appropriately control the strength of the magnetic field of the layer 33 to be applied to the magnetic layers 22a to 22g of the stack 20.

Moreover, the signal magnetic field of the magnetic medium 3 is captured by the projecting portion 20c of the stack 20. Thus, erroneous detection of adjacent signal magnetic fields is prevented, and the rate of resistance change and the resistance can be increased. Furthermore, the magnetic field capture limiting portion 14a is formed at the position corresponding to a part of the stack 20 close to the magnetic medium 3 for restraining 20b from capturing the signal magnetic field, so as to partially limit an effect of the signal magnetic field on the stack. Thus, erroneous detection of adjacent signal magnetic fields can be more reliably prevented.

Moreover, the stack 20 is in contact with the first shield layer 12 in the extending portion 20d, whereby the signal magnetic field can be more effectively captured and thus the rate of resistance change can be further increased. Furthermore, the distance between the end surface 20g of the projecting portion 20c and the second region 20b is 0.1 μm or less. Thus, the signal magnetic field reliably extends to the second region 20b. Therefore, the signal magnetic field can be reliably captured.

Moreover, the magnetic layers 22a to 22g are made of a material containing at least Co in a group including Co, Fe and Ni, or a material containing at least Ni in a group including Ni, Co, Fe, Cr, Ta, Rh, Mo, Zr and Nb, whereby a high rate of resistance change or high resistance can be obtained. Additionally, each of the magnetic layers 22a to 22g includes a cobalt-containing layer made of a material containing at least Co in a group including Co, Fe and Ni and a nickel-containing layer made of a material containing at least Ni in a group including Ni, Co, Fe, Cr, Ta, Rh, Mo, Zr and Nb, whereby a high rate of resistance change and high resistance can be obtained. Furthermore, the number of magnetic layers is from 2 to 20 inclusive, whereby variation in the orientations of magnetizations can be prevented.

Moreover, the thickness of each of the nonmagnetic layers 21b to 21g is set so as to locally maximize antiferromagnetic coupling between two magnetic layers adjacent to each other with each of the nonmagnetic layers 21b to 21g in between, whereby the rate of resistance change can be increased. Moreover, the antiferromagnetic coupling energy is within a range of from $0.1 \times 10^{-4}$ J/m² to $2.0 \times 10^{-4}$ J/m², whereby the rate of resistance change can be increased without reducing the sensitivity.

Furthermore, at least one of the nonmagnetic layers 21b to 21g is made of a material containing at least one element in a group including Au, Ag, Cu, Ru, Rh, Re, Pt and W, whereby antiferromagnetic coupling can occur between two magnetic layers adjacent to each of the nonmagnetic layers 21b to 21g. Furthermore, at least one of the nonmagnetic layers 21b to 21g is made of a material containing Ni and Cr, whereby the rate of resistance change can be increased and the thermal stability can be improved. More particularly, the underlayer 21a is made of a material containing Ni and Cr, whereby the rate of resistance change can be further increased and the thermal stability can be further improved.

Moreover, a current is passed in the direction of stacking of the stack 20, whereby the rate of resistance change and the resistance can be further increased, as compared to the case in which a current is passed parallel to a stacking surface. In addition, a current is passed through the stack 20 through the shield layers 12 and 14, the gap layers 31 and 32, the inserted layer 34 and the layer 33, whereby it is not necessary to form an additional lead layer and therefore manufacturing costs are reduced.

Second Embodiment

Figure 17:
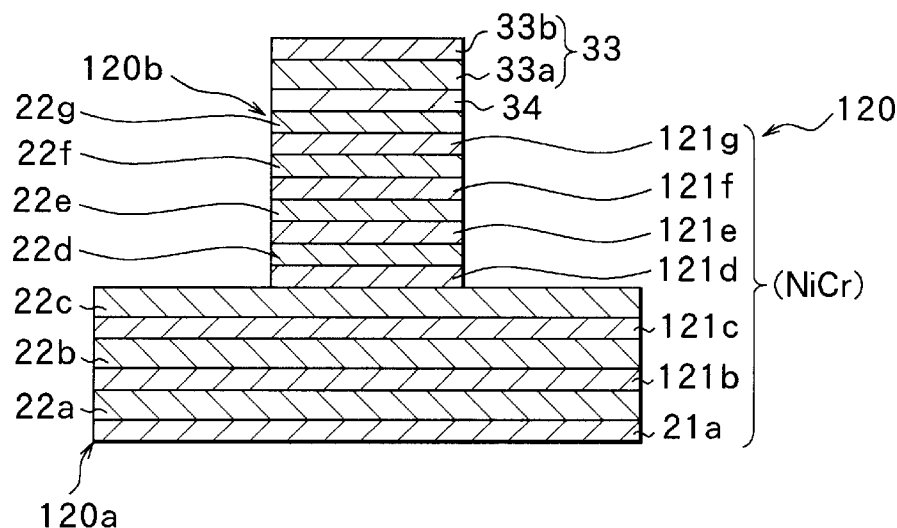
FIG. 17 is a sectional view of a general structure of a magnetic transducer of a thin film magnetic head according to a second embodiment.

Next, a second embodiment of the invention will be described with reference to FIG. 17. A thin film magnetic head according to the second embodiment is the same as the thin film magnetic head according to the first embodiment except that nonmagnetic layers 121b to 121g of a stack 120 are made of other materials. Only the stack 120, the inserted layer 34 and the layer 33 are shown in FIG. 17. The same structural components as the structural components of the first embodiment are indicated by the same reference numerals, and the detailed description thereof is omitted.

In the stack 120 of the embodiment, it is preferable that the nonmagnetic layers 121b to 121g are made of a material containing Ni and Cr. Specifically, it is preferable that the nonmagnetic layers 121b to 121g are made of $(Ni_aCr_{100-a})_bA_{100-b}$ similarly to the underlayer 21a, where A, a and b are as mentioned in the description of the first embodiment. The composition of each of the nonmagnetic layers 121b to 121g may be identical with or different from the composition of the underlayer 21a.

According to the embodiment, the nonmagnetic layers 121b to 121g are made of a material containing Ni and Cr. Thus, diffusion of the structural components between the magnetic layers 22a to 22g and the nonmagnetic layers 121b to 121g can be prevented. Therefore, the thermal stability can be further improved.

In the embodiment, all of the nonmagnetic layers 121b to 121g are made of a material containing Ni and Cr. However, at least one of the nonmagnetic layers 121b to 121g may be made of a material containing Ni and Cr.

Third Embodiment

Figure 18:
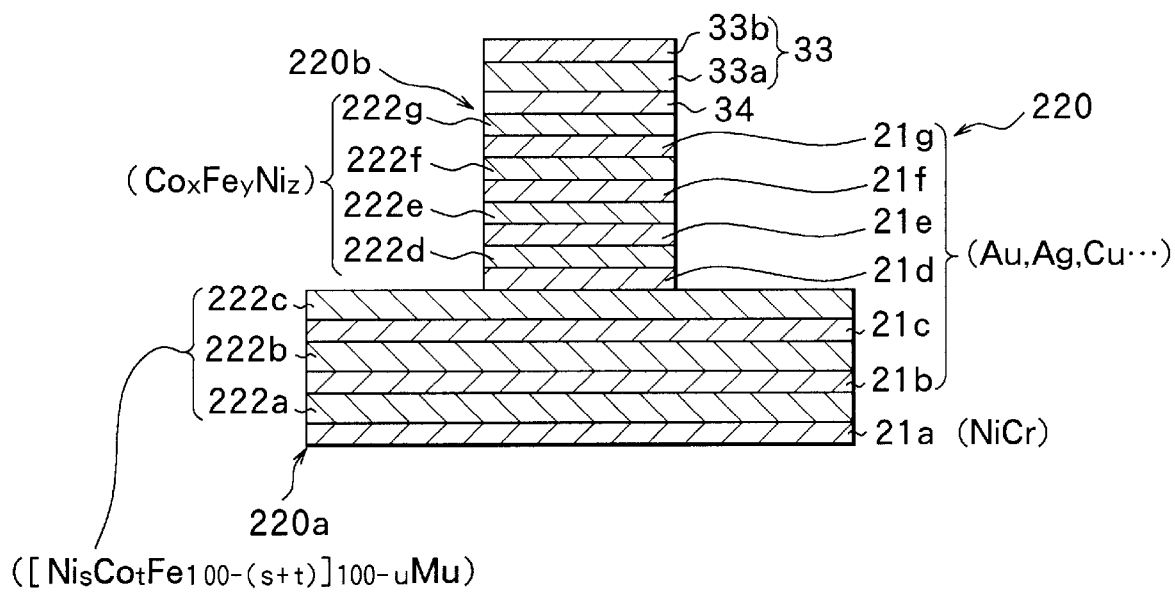
FIG. 18 is a sectional view of a general structure of a magnetic transducer of a thin film magnetic head according to a third embodiment.

Next, a third embodiment of the invention will be described with reference to FIG. 18. A thin film magnetic head according to the third embodiment is the same as the thin film magnetic head according to the first embodiment except that the material or composition of magnetic layers 222a to 222c included in a first region 220a of a stack 220 differs from the material or composition of magnetic layers 222d to 222g included in a second region 220b. Only the stack 220, the inserted layer 34 and the layer 33 are shown in FIG. 18.

Preferably, the magnetic layers 222a to 222c of the first region 220a are made of, for example, a material containing at least Ni in a group including Ni, Co, Fe, Cr, Ta, Rh, Mo, Zr and Nb. Specifically, it is preferable that the magnetic layers 222a to 222c are made of $[Ni_sCo_tFe_{100-(s+t)}]_{100-u}M_u$, where s, t and u are as mentioned in the description of the first embodiment.

Preferably, the magnetic layers 222d to 222g of the second region 220b are made of, for example, a material containing at least Co in a group including Co, Fe and Ni. Specifically, it is preferable that the magnetic layers 222d to 222g are made of $Co_xFe_yNi_z$, where x, y and z are as mentioned in the description of the first embodiment.

According to the embodiment, the magnetic layers 222a to 222c included in the first region 220a and the magnetic layers 222d to 222g included in the second region 220b are made of the above-described materials. Therefore, both the resistance and the rate of resistance change can be increased.

In the embodiment, the thickness of each of the magnetic layers 222a to 222c of the first region may be, for example, 1 nm to 6 nm, and the thickness of each of the magnetic layers 222d to 222g of the second region may be, for example, 1 nm to 4 nm.

In the embodiment, the nonmagnetic layers 21b to 21g are made of a material containing at least one element in a group including Au, Ag, Cu, Ru, Rh, Re, Pt and W. However, the nonmagnetic layers 21b to 21g may be made of a material containing Ni and Cr.

Fourth Embodiment

Figure 19:
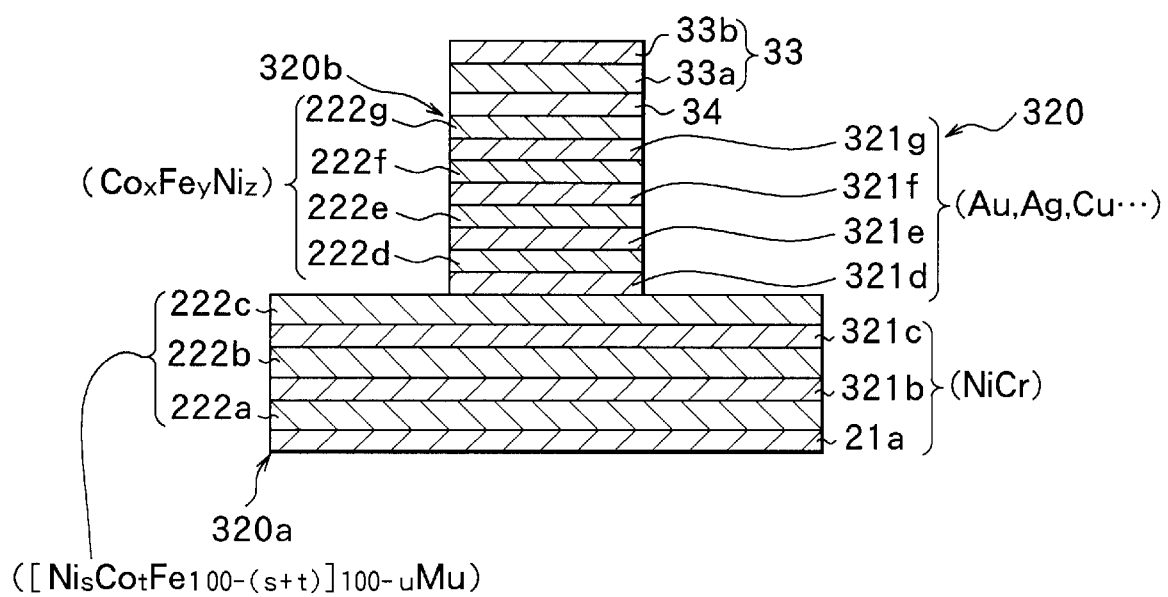
FIG. 19 is a sectional view of a general structure of a magnetic transducer of a thin film magnetic head according to a fourth embodiment.

Next, a fourth embodiment of the invention will be described with reference to FIG. 19. A thin film magnetic head according to the fourth embodiment is the same as the thin film magnetic head according to the third embodiment except that the material or composition of nonmagnetic layers 321b and 321c included in a first region 320a of a stack 320 differs from the material or composition of nonmagnetic layers 321d to 321g included in a second region 320b. Only the stack 320, the inserted layer 34 and the layer 33 are shown in FIG. 19.

In the stack 320 of the embodiment, it is preferable that the nonmagnetic layers 321b and 321c included in the first region 320a are made of a material containing Ni and Cr. Specifically, it is preferable that the nonmagnetic layers 321b and 321c are made of $(Ni_aCr_{100-a})_bA_{100-b}$, where A, a and b are as mentioned in the description of the first embodiment. The composition of each of the nonmagnetic layers 321b and 321c may be identical with or different from the composition of the underlayer 21a.

Preferably, the nonmagnetic layers 321d to 321g included in the second region 320b are made of metal containing at least one element in a group including Au, Ag, Cu, Ru, Rh, Re, Pt and W, and the percentage of content of the at least one element is 60 at % or more.

According to the embodiment, the nonmagnetic layers 321b and 321c are made of a material containing Ni and Cr, and the nonmagnetic layers 321d to 321g are made of a material containing at least one element in a group including Au, Ag, Cu, Ru, Rh, Re, Pt and W. Therefore, the rate of resistance change can be increased, and the thermal stability can be improved.

EXAMPLES

Specific examples of the invention will be described in detail.

EXAMPLES 1 TO 3

The thin film magnetic heads 1 shown in FIG. 5 were prepared as examples 1 to 3. First, the insulating layer 11 of 3 $\mu$m thick was deposited on the base 2d made of $Al_2O_3$—TiC by sputtering using $Al_2O_3$. The first shield layer 12 of 2 $\mu$m thick was formed on the insulating layer 11 by plating using NiFe. Then, the first gap layer 31 of 10 nm thick was formed on the first shield layer 12 by sputtering using Ta. Subsequently, the underlayer 21a of 5 nm thick was formed on the first gap layer 31 by sputtering using $Ni_{58}Cr_{42}$. After that, the first gap layer 31 and the underlayer 21a were patterned by i-rays photolithography.

Subsequently, the magnetic layers and the nonmagnetic layers for constituting the stack 20 were alternately deposited on the underlayer 21a by sputtering. The inserted layer 34, the exchange coupling layer 33a, the antiferromagnetic layer 33b and the second gap layer 32 were formed on the stack 20. In this case, the material of the magnetic layer was $Ni_{75}Fe_{20}Co_5$, and the thickness thereof was 2 nm. The material of the nonmagnetic layer was Cu, and the thickness thereof was 1.9 nm. The material of the inserted layer 34 was Ru, and the thickness thereof was 0.8 nm. The material of the exchange coupling layer 33a was $Co_{90}Fe_{10}$, and the thickness thereof was 5 nm. The material of the antiferromagnetic layer 33b was as shown in Table 1, and the thickness thereof was 12 nm. The material of the second gap layer 32 was Ta, and the thickness thereof was 3 nm. The number of magnetic layers of the first region 20a was 5, and the number of magnetic layers of the second region 20b was 10.

As described above by referring to the aforementioned embodiments, the first region 20a of the stack 20 had the projecting portion 20c, the extending portion 20d and the wide portions 20e and 20f, and the magnetic layers were brought into contact with the first shield layer 12 in a part of the extending portion 20d. The width (MR track width) of the end surface 20g of the first region 20a along the direction perpendicular to the direction of stacking, the length (MR height) of the second region 20b along the direction perpendicular to the air bearing surface 2e and the length of the projecting portion 20c were set as shown in Table 1.

TABLE 1

| Example | Antiferromagnetic film | MR track width ($\mu$m) | MR height ($\mu$m) | Measured current (mA) | Length of projecting portion ($\mu$m) |
|---|---|---|---|---|---|
| 1 | RuRhMn | 0.10 | 0.05 | 5.0 | 0.05 |
| 2 | PtMn | 0.10 | 0.05 | 5.0 | 0.05 |
| 3 | CoPtCr | 0.10 | 0.05 | 5.0 | 0.05 |

| | Standardized output ($\mu$V/$\mu$m) | COV (%) | Heat test | |
|---|---|---|---|---|
| Example | | | Standardized output after heat test ($\mu$V/$\mu$m) | Rate of heat deterioration (%) |
| 1 | 15700 | 0.8 | 15000 | −4.5 |
| 2 | 14600 | 0.5 | 14100 | −3.4 |
| 3 | 13700 | 0.7 | 13200 | −0.7 |

Then, the insulating layer 13 of 40 nm thick was formed on the base 2d by sputtering using $Al_2O_3$. The second shield layer 14 of 40 $\mu$m thick having the magnetic field capture limiting portion 14a was deposited on the insulating layer 13 by sputtering using NiFe. Subsequently, the recording head 1b was formed on the second shield layer 14 with the insulating layer 15 in between. Thus, the thin film magnetic heads 1 of the examples 1 to 3 were obtained. A method of manufacturing the recording head 1b of the examples is omitted because of little influence on reproducing properties.

While a current was passed through the stack 20 of each of the obtained thin film magnetic heads of the examples 1 to 3, an external signal magnetic field was applied to the stack 20. In this state, standardized output, an output covariant value (COV) and the rate of heat deterioration obtained through a heat test were determined. The standardized output corresponds to head output in a unit length of the track width. The output covariant value is calculated in the following manner: a standard deviation σ (sigma) of variation in head output values obtained at the time of repeating recording and reproducing 100 times is divided by an average of head outputs. The heat test corresponds to heat treatment at 130° C. for 100 hours. The rate of heat deterioration corresponds to the rate of decrease in the standardized output after the heat test to the standardized output before the heat test. A measured current was set at 5 mA.

As can be seen from Table 1, according to the examples, the standardized output was 13000 $\mu V/\mu m$ or more and was a sufficiently high value. Moreover, the output covariant value was less than 1, the rate of heat deterioration was –5% or more, and both of them were good values. In other words, it turns out that the layer 33 is formed on one end of the stack 20 in the direction of stacking, whereby the thin film magnetic head can be simply manufactured and sufficient properties can be obtained.

Figure 20:
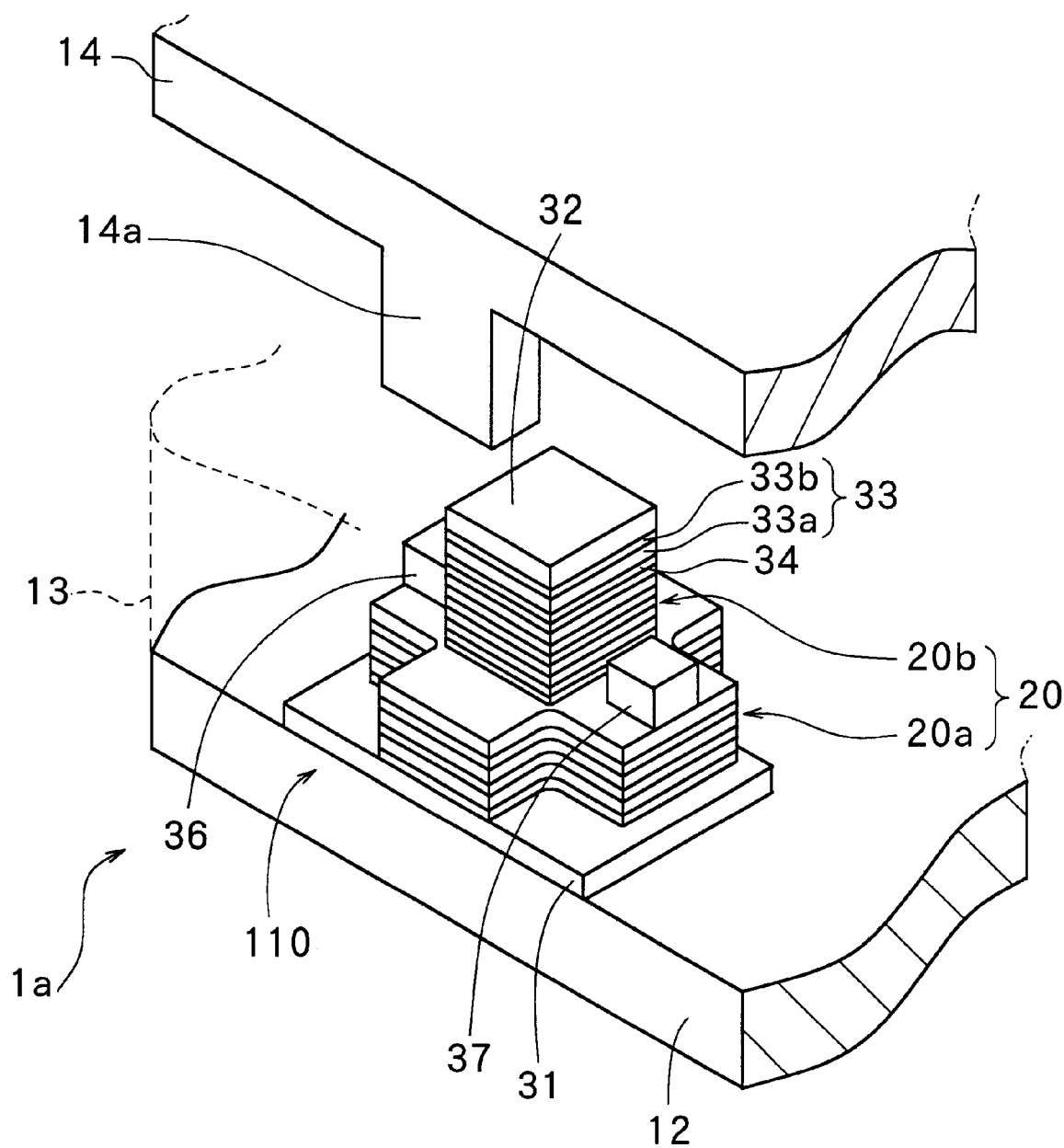
FIG. 20 is a perspective view of another example of a structure of a magnetic transducer of a thin film magnetic head.

Although the invention has been described above by referring to some embodiments and examples, the invention is not limited to these embodiments and examples and various modifications of the invention are possible. For example, as shown in FIG. 20, in addition to the layer 33, additional fixed-orientation-of-magnetization layers 36 and 37 may be formed so as to sandwich the stack 20 therebetween in the direction perpendicular to the direction of stacking.

In the above-described embodiments, the projecting portion 20c for capturing the signal magnetic field is provided on the side of the stack 20 close to the base 2d, and the layer 33 is formed on the side opposite to the base 2d. However, the layer 33 may be formed on the side of the stack 20 close to the base 2d, and the projecting portion 20c may be provided on the side opposite to the base 2d. Alternatively, the fixed-orientation-of-magnetization layer may be provided on both sides of the stack 20 in the direction of stacking.

In the above-described embodiments, the first region 20a and the second region 20b are stacked in this order on the base 2d. However, the second region 20b and the first region 20a may be stacked in this order on the base 2d. In this case, the nonmagnetic layer located on the outermost side of the second region 20b is used as the underlayer. That is, the nonmagnetic layer located on one outermost side of the stack is used as the underlayer.

The stacks 20, 120, 220 and 320 have a stacked structure starting with the nonmagnetic layer. However, the stack may have a stacked structure starting with the magnetic layer. In the above-described embodiments, the stack has the underlayer. However, the stack may have no underlayer. In this case, it is preferable that at least one of the nonmagnetic layers is made of a material containing Ni and Cr. More preferably, the nonmagnetic layer to be deposited at the earlier time of manufacture is made of a material containing Ni and Cr.

In the above-described embodiments, the underlayer or at least one of the nonmagnetic layers contains Ni and Cu. However, neither of the underlayer and the nonmagnetic layers may contain Ni and Cu. In the above-described embodiments, the stack has a stacked structure starting with the nonmagnetic layer. However, the stack may have a stacked structure starting with the magnetic layer. In the fourth embodiment, the first region differs from the second region in the material or composition of the magnetic layers and the nonmagnetic layers. However, the first region may differ from the second region in the material or composition of only the nonmagnetic layers.

The magnetic field capture limiting portion 14a is provided in the second shield layer 14. However, the magnetic field capture limiting portion 14a may be provided in the first shield layer 12 or both the first shield layer 12 and the second shield layer 14. In the above-described embodiments, the stack 20 is in contact with the first shield layer 12. However, the stack 20 may be in contact with the second shield layer 14 or both the first shield layer 12 and the second shield layer 14.

In the above-mentioned embodiments, the description has been given with regard to the case in which a magnetic transducer of the invention is used in a composite thin film magnetic head. However, the magnetic transducer of the invention can be used in a thin film magnetic head for reproducing only. Moreover, the recording head and the reproducing head may be stacked in reverse order. In addition, the magnetic transducer of the invention can be applied to, for example, a sensor for sensing a magnetic signal (an accelerometer, etc.), a memory for storing a magnetic signal, or the like, as well as the thin film magnetic head described by referring to the above-mentioned embodiments.

As described above, according to a magnetic transducer or a thin film magnetic head of the invention, a magnetic domain control layer for controlling the orientations of magnetizations of the magnetic layers of the stack is formed on at least one side of the stack in the direction of stacking. Thus, the orientations of magnetizations of the magnetic layers are matched to one another, and therefore noiseless good output can be obtained. Moreover, an effect of simplifying the manufacturing process is achieved, as compared to the case in which a hard magnetic film or the like is located on both sides of the stack in the direction perpendicular to the direction of stacking.

According to another magnetic transducer or another thin film magnetic head of the invention, a magnetic field applying layer for applying a magnetic field to at least a part of the stack in a fixed direction is formed on at least one side of the stack in the direction of stacking. Thus, the orientations of magnetizations of the magnetic layers are matched to one another by the applied magnetic field. Therefore, noiseless good output can be obtained. Moreover, an effect of simplifying the manufacturing process is achieved, as compared to the case in which a hard magnetic film or the like is located on both sides of the stack in the direction perpendicular to the direction of stacking.

According to still another magnetic transducer or still another thin film magnetic head of the invention, a fixed-orientation-of-magnetization layer having magnetization fixed in a fixed direction is formed on at least one side of the stack in the direction of stacking. Thus, the orientations of magnetizations of the magnetic layers are matched to one another by the fixed magnetization. Therefore, noiseless good output can be obtained. Moreover, an effect of simplifying the manufacturing process is achieved, as compared to the case in which a hard magnetic film or the like is located on both sides of the stack in the direction perpendicular to the direction of stacking.

According to a magnetic transducer of another aspect of the invention, the fixed-orientation-of-magnetization layer has an antiferromagnetic layer and an exchange coupling layer exchange-coupled to the antiferromagnetic layer. An effect of being able to appropriately control the strength of the magnetic field to be applied to the magnetic layers of the stack is therefore achieved.

According to a magnetic transducer of still another aspect of the invention, the antiferromagnetic layer is made of a material containing at least one element in a group including Pt, Ru, Rh, Pd, Ni, Au, Ag, Cu, Ir, Cr and Fe, and Mn. Moreover, the exchange coupling layer is made of a material containing at least one element in a group including Fe, Co and Ni. Therefore, achieved is an effect of being able to generate an appropriate strength of the magnetic field by exchange coupling between the antiferromagnetic layer and the exchange coupling layer.

According to a magnetic transducer of a further aspect of the invention, an inserted layer made of a nonmagnetic material is provided between the fixed-orientation-of-magnetization layer and the stack. Therefore, achieved is an effect of being able to appropriately control the strength of the magnetic field of the fixed-orientation-of-magnetization layer to be applied to the magnetic layers of the stack.

According to a magnetic transducer of a further aspect of the invention, a thickness of the inserted layer is from 1 nm to 10 nm inclusive. Moreover, the inserted layer is made of a material containing at least one element in a group including Au, Ag, Cu, Ru, Rh, Re, Pt and W. An effect of being able to prevent excessive limitations on the orientations of magnetizations of the magnetic layers of the stack is therefore achieved.

According to a magnetic transducer of a further aspect of the invention, a projecting portion is provided on a side of the stack facing a signal magnetic field. Moreover, a length of the projecting portion along the projecting direction thereof is 0.1 μm or less. An effect of being able to prevent erroneous detection of adjacent signal magnetic fields is therefore achieved.

According to a magnetic transducer of a further aspect of the invention, a magnetic field capture limiting portion for partially limiting an effect of a signal magnetic field on the stack is provided in an area on the side of the stack facing a signal magnetic field. An effect of being able to more reliably prevent erroneous detection of adjacent signal magnetic fields is therefore achieved.

According to a magnetic transducer of a further aspect of the invention, at least one of the magnetic layers is made of a material containing at least Co in a group including Ni, Co and Fe, or a material containing at least Ni in a group including Ni, Co, Fe, Cr, Ta, Rh, Mo, Zr and Nb. An effect of being able to increase the rate of resistance change or the resistance is therefore achieved.

According to a magnetic transducer of a further aspect of the invention, at least one of the magnetic layers has a stacked structure including a nickel-containing layer made of a material containing at least Ni in a group including Ni, Co, Fe, Cr, Ta, Rh, Mo, Zr and Nb, and a cobalt-containing layer made of a material containing at least Co in a group including Co, Fe and Ni. An effect of being able to increase the rate of resistance change and the resistance is therefore achieved.

According to a magnetic transducer of a further aspect of the invention, a thickness of each of the magnetic layers is from 1 nm to 6 nm inclusive. Therefore, achieved is an effect that the antiferromagnetic coupling energy induced between adjacent magnetic layers can be within an optimum range.

According to a magnetic transducer of a further aspect of the invention, the number of the magnetic layers of the stack is from 2 to 20 inclusive. Thus, achieved is an effect of being able to increase the rate of resistance change and to prevent variation in the orientations of magnetizations.

According to a magnetic transducer of a further aspect of the invention, at least one of the nonmagnetic layers is made of a material containing at least one element in a group including Au, Ag, Cu, Ru, Rh, Re, Pt and W. Thus, an effect of being able to increase the rate of resistance change is achieved.

According to a magnetic transducer of a further aspect of the invention, a thickness of each of the nonmagnetic layers is set so as to locally maximize antiferromagnetic coupling between two magnetic layers adjacent to each other with each of the nonmagnetic layers in between. An effect of being able to increase the rate of resistance change is therefore achieved.

According to a magnetic transducer of a further aspect of the invention, the antiferromagnetic coupling energy induced between two magnetic layers adjacent to each other with each of the nonmagnetic layers in between is from $0.1 \times 10^{-4}$ J/m² to $2.0 \times 10^{-4}$ J/m² inclusive. An effect of being able to increase the rate of resistance change without reducing the sensitivity to the signal magnetic field is therefore achieved.

According to a magnetic transducer of a further aspect of the invention, at least one of the nonmagnetic layers is made of a material containing Ni and Cr. An effect of improving the thermal stability is therefore achieved.

According to a magnetic transducer of a further aspect of the invention, the stack has a plurality of regions into which the stack is divided in the direction of stacking, and at least two regions of the plurality of regions differ from each other in a material or composition of the magnetic layers. An effect of being able to increase both the rate of resistance change and the resistance is therefore achieved.

According to a magnetic transducer of a further aspect of the invention, the magnetic layers of a first region are made of a material containing at least Ni in a group including Ni, Co, Fe, Cr, Ta, Rh, Mo, Zr and Nb, and the magnetic layers of a second region are made of a material containing at least Co in a group including Co, Fe and Ni. An effect of being able to increase both the rate of resistance change and the resistance is therefore achieved.

According to a thin film magnetic head of another aspect of the invention, a current path for passing a current through the stack in the direction of stacking is further provided. Therefore, the resistance and the rate of resistance change can be increased, as compared to the case in which a current is passed through the stack in the direction perpendicular to the direction of stacking.

According to a thin film magnetic head of still another aspect of the invention, the shield layers and the gap layers function as the current path. Thus, an additional lead layer is not required. Therefore, an effect of reducing the number of components is achieved.

Obviously many modifications and variations of the present invention are possible in the light of the above teachings. It is therefore to be understood that within the scope of the appended claims the invention may be practiced otherwise than as specifically described.

What is claimed is:

1. A magnetic transducer comprising:
    a stack having a plurality of magnetic layers stacked alternately with a plurality of nonmagnetic layers; and
    a fixed-orientation-of-magnetization layer formed on at least one side of the stack in the direction of stacking and having magnetization fixed in a fixed direction, wherein the stack has a projecting portion facing a signal magnetic field.

2. A magnetic transducer according to claim 1, wherein a length of the projecting portion along the projecting direction thereof is 0.1 μm or less.

3. A magnetic transducer according to claim 1, further comprising a magnetic field capture limiting portion located in an area on a side of the stack facing a signal magnetic field, for partially limiting an effect of a signal magnetic field on the stack.

4. A magnetic transducer according to claim 1, further comprising a magnetic field capture limiting portion made of a magnetic material and located in an area corresponding to a part of the stack on a side of the stack facing an signal magnetic field.

5. A thin film magnetic head having a magnetic transducer according to claim 1.

6. A magnetic transducer comprising:
   a stack having a plurality of magnetic layers stacked alternately with a plurality of nonmagnetic layers; and
   a fixed-orientation-of-magnetization layer formed on at least one side of the stack in the direction of stacking and having magnetization fixed in a fixed direction, wherein the antiferromagnetic coupling energy induced between two magnetic layers adjacent to each of the plurality of nonmagnetic layers is from $0.1 \times 10^{-4}$ $J/m^2$ to $2.0 \times 10^{-4}$ $J/m^2$ inclusive.

7. A magnetic transducer according to claim 6, further comprising:
   a magnetic domain control layer formed on at least one side of the stack in the direction of stacking, for controlling the orientations of magnetizations of the magnetic layers.

8. A magnetic transducer according to claim 6, further comprising:
   a magnetic field applying layer formed on at least one side of the stack in the direction of stacking, for applying a magnetic field in a fixed direction to at least a part of the stack.

9. A thin film magnetic head having a magnetic transducer according to claim 6.

10. A thin film magnetic head according to claim 9 further comprising a current path for passing a current through the stack in the direction of stack.

11. A thin film magnetic head according to claim 10 further comprising a pair of shield layers for sandwiching the stack therebetween with a pair of gap layers in between, wherein the gap layers and the shield layers function as the current path.

12. A magnetic transducer comprising:
    a stack having a plurality of magnetic layers stacked alternately with a plurality of nonmagnetic layers; and
    a fixed-orientation-of-magnetization layer formed on at least one side of the stack in the direction of stacking and having magnetization fixed in a fixed direction, wherein the stack is divided into a plurality of regions in the direction of stacking, and at least two regions of the plurality of regions differ from each other in a material or composition of the magnetic layers and in their cross-sectional profiles.

13. A magnetic transducer according to claim 12, wherein the stack has a first region where the magnetic layers are made of a material containing at least nickel in a group including nickel, cobalt, iron, chromium, tantalum, rhodium, molybdenum, zirconium and niobium, and a second region where the magnetic layers are made of a material containing at least cobalt in a group including nickel, cobalt and iron.

14. A thin film magnetic head having a magnetic transducer according to claim 12.

* * * * *